United States Patent [19]

Matsuoka et al.

[11] Patent Number: 5,022,977

[45] Date of Patent: Jun. 11, 1991

[54] ION GENERATION APPARATUS AND THIN FILM FORMING APPARATUS AND ION SOURCE UTILIZING THE ION GENERATION APPARATUS

[75] Inventors: Morito Matsuoka, Hitachi; Ken-ichi Ono, Mito, both of Japan

[73] Assignee: Nippon Telegraph and Telephone Corporation, Tokyo, Japan

[21] Appl. No.: 198,500

[22] PCT Filed: Sep. 24, 1987

[86] PCT No.: PCT/JP87/00695
§ 371 Date: May 25, 1988
§ 102(e) Date: May 25, 1988

[87] PCT Pub. No.: WO88/02546
PCT Pub. Date: Apr. 7, 1988

[30] Foreign Application Priority Data

| Sep. 29, 1986 | [JP] | Japan | 61-230829 |
| Sep. 29, 1986 | [JP] | Japan | 61-230830 |
| Aug. 21, 1987 | [JP] | Japan | 62-208003 |
| Aug. 21, 1987 | [JP] | Japan | 62-208004 |
| Aug. 28, 1987 | [JP] | Japan | 62-214899 |
| Aug. 28, 1987 | [JP] | Japan | 62-214900 |

[51] Int. Cl.$^5$ ............... C23C 14/34; H01G 27/00
[52] U.S. Cl. ............... 204/298.16; 204/192.12; 250/423 R; 250/492.3; 315/111.41; 315/111.81

[58] Field of Search ............... 204/192.11, 192.12, 204/298 BD, 298 ME, 298 SG, 298 CM, 298 EE, 298 MN, 298.04, 298.16, 298.17, 298.21, 298.38, 298.37; 315/111.31, 111.41, 111.81; 250/423 R, 427, 492.1, 492.3

[56] References Cited

U.S. PATENT DOCUMENTS

| 4,721,553 | 1/1988 | Saito et al. | 204/192.12 |
| 4,739,169 | 4/1988 | Kurosawa et al. | 250/423 R |
| 4,911,814 | 3/1990 | Matsuoka et al. | 250/423 R |

FOREIGN PATENT DOCUMENTS 3227777 9/1988 Japan ............... 204/298

*Primary Examiner*—Nam X. Nguyen
*Attorney, Agent, or Firm*—Spencer & Frank

[57] ABSTRACT

An ion generation apparatus utilizes microwaves and employs the electron cyclotron resonance phenomenon to generate plasma. The plasma is confined in a plasma generation chamber by a mirror field, whereby high density plasma is obtained. A target disposed within the plasma generation chamber is sputtered by the ions in the high density plasma, so that a large number of ions is produced. This ion generation apparatus can be employed in a thin film forming apparatus which forms a thin film on the surface of a substrate by directing the ions and neutral particles to the substrate. An ion extracting grid may be included. Permanent magnets may be disposed at the upper and lower ends of the target disposed in the plasma generation chamber so as to permit the leakage of magnetic flux to the inner surface of the target. This permits the film to be formed at a high rate even when the voltage applied to the target is relatively low.

32 Claims, 32 Drawing Sheets

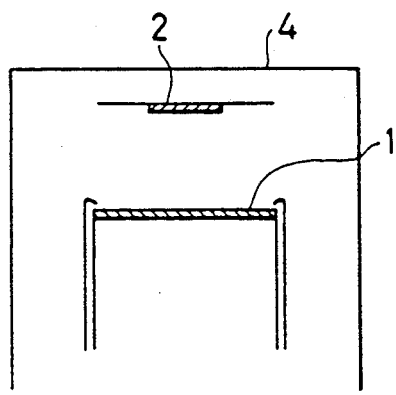
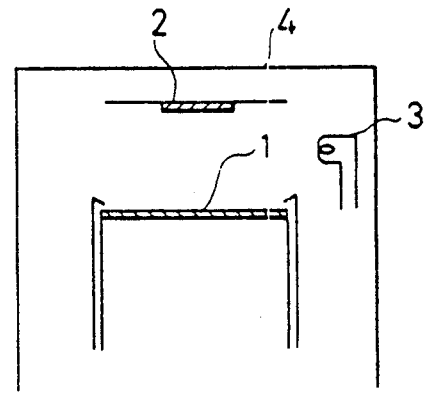
Fig-1
(PRIOR ART)
Fig-2
(PRIOR ART)
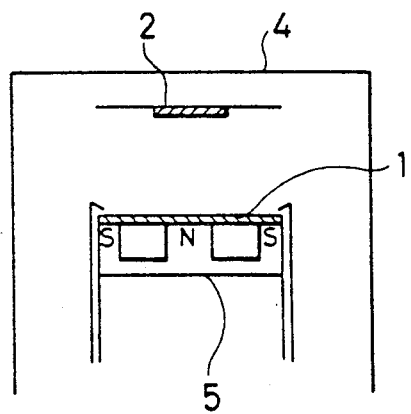
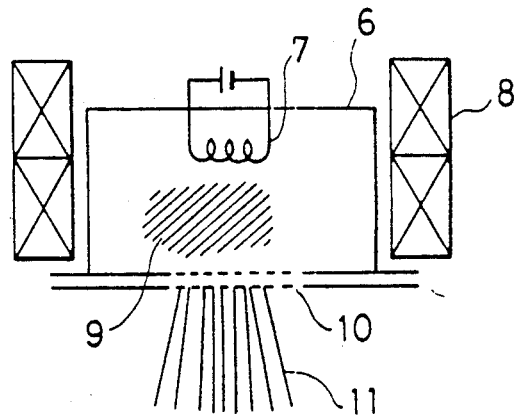
Fig-3
(PRIOR ART)
Fig-4
(PRIOR ART)

ION GENERATION APPARATUS AND THIN FILM FORMING APPARATUS AND ION SOURCE UTILIZING THE ION GENERATION APPARATUS

BACKGROUND OF THE INVENTION

The present invention relates to an ionization apparatus capable of efficient ionization by utilizing a sputtering process carried out by high density plasma. The present invention also relates to a thin film forming apparatus capable of forming various thin films at a high rate and a high degree of efficiency with ions and neutral particles produced by the ionization apparatus, and to an ion source with a high degree of efficiency and a high degree of yield (high ion current) from which the ions produced by the ionization apparatus are extracted so as to form various thin films and so as to carry out an etching process.

So-called sputtering apparatuses for sputtering targets as such thin film formation elements in plasma, thereby forming thin films, have been widely used to form films of various materials in various fields. For instance, as shown in FIG. 1, a conventional sputtering apparatus in which a target 1 and a substrate 2 are disposed in opposing relationship with each other in a vacuum chamber 4, which is generally called a two-electrode sputtering apparatus (refer to F.M.D'HEURLE: Metall. Trans. Vol. 1, March, 1970, 725732), has been used and is well known to those skilled in the art. So is the three-electrode sputtering apparatus shown in FIG. 2, in which a third electrode 3 for emitting ions is additionally provided (W.W.Y. Lee and D.Oblas: J. Appl. Phys. Vol. 46, No. 4, 1975, 1728-1732). Furthermore the magnetron sputtering process (refer to R. K. Waits: J. Vac. Sci. Technol, Vol. 15, No. 2, 1978, pp. 179-187) in which, as shown in FIG. 3, a magnet 5 is used to apply a magnetic field of suitable strength to the target 1 so that high density and low temperature plasma is produced, whereby a thin film is formed at a high rate, has been used and is well known to those skilled in the art. These apparatus mainly comprise the vacuum chamber 4 with the target 1 as a thin film forming element and the substrate 2 upon which a thin film is formed, a gas introduction system, and a gas discharge system, and plasma is generated within the vacuum chamber 4.

In order to form a thin film at a high rate using one of the above-mentioned apparatuses, it is necessary to maintain the plasma at a high density. However, in the case of the two-electrode or diode sputtering apparatus, the higher the density of plasma, the more quickly a voltage applied to the target is increased. At the same time, the temperature of the substrate quickly rises because of the bombardment of the substrate with high-energy particles and high-energy electrons within the plasma, so the risk of damage to the formed film increases. Therefore, this apparatus can be only used for special heat-resisting substrates, thin film materials and film compositions. In the case of the three-electrode or triode sputtering apparatus, the plasma density is increased because the electrons are supplied from the third electrode into the plasma, but just like the two-electrode or diode sputtering apparatus, if a thin film is to be formed at a high rate, the temperature of the substrate quickly rises. As a result, only a limited small number of thin film materials and substrates may be used.

On the other hand, in the case of the high rate magnetron sputtering apparatus, the gamma ($\tau$) electrons (secondary electrons) emitted from the target, which are needed to ionize the gas in the plasma, are confined over the surface of the target by both the magnetic field and the electric field, so that a dense plasma can be produced at a low gas pressure. In practice, the high rate sputtering processes are carried out at a low gas pressure of the order of $10^{-3}$ Torr, so that they are widely used for forming various thin films at a high rate. However, in the case of the sputtering apparatus just described above, because of the bombardment by the ions in the plasma (mainly $Ar^+$ ions), the high-energy neutral particles emitted from the target (mainly Ar reflected at the surface of the target), and the negative ions on the film being formed, changes in the composition of the thin film occur and the film or the substrate is damaged. In practice, it is well known to those skilled in the art that in the case of the formation of a ZnO film, the composition of the portion of the ZnO film immediately above the erosion area of the target and that of the other portion of the ZnO film are completely different from each other. Therefore, the bombardment of the substrate by the high-energy particles presents serious problems. In addition, the erosion area of the target is distributed locally, so that this apparatus has a low degree of utilization efficiency and cannot be used on an industrial scale.

Furthermore, when thin films are formed using the prior art sputtering apparatuses, gases and particles in the plasma are not ionized satisfactorily and particles which are sputtered to form a thin film land on the substrate in an almost neutral state. Therefore, since a sufficient degree of reaction activity cannot be attained, in order to obtain some oxides and thermally nonequilibrium materials, the temperature of the substrate must be raised to a high temperature ranging from 500° C. to 800° C. Moreover, almost all the power supplied to the plasma is consumed in the form of thermal energy, so that the ratio of the power used for the formation of the plasma (for electrolytic dissociation) to the power supplied to the apparatus is low. Consequently the power efficiency drops.

Furthermore, in any of the above-mentioned sputtering apparatuses, a stable discharge cannot be ensured at a gas pressure lower than $10^{-3}$ Torr, resulting in the defect that many impurities are entrapped in the thin film.

Meanwhile, Matsuo et al. have proposed a process for forming a thin film in which a plasma which includes a material to be deposited is generated under the electron cyclotron resonance (ECR) condition by using microwaves, and the plasma is drawn onto a specimen for forming the thin film (U.S. Pat. No. 4,401,054). However, this process cannot form thin metal films and thin metal compound films. Matsuo and Ono (U.S. Pat. No. 4,492,620) and Ono et al. (Jpn. J. Appl. Phys. Vol. 23, No. 8, 1984, L534-L536) have disclosed a microwave plasma deposition apparatus in which a target is sputtered by microwave plasma utilizing ECR and sputtered particles are deposited on the surface of the substrate, thereby forming a thin film.

These apparatuses accomplish sputtering by utilizing the excellent features of the microwave plasma, such as the capability of discharging at $10^{-5}$-$10^{-4}$ Torr and of producing highly active plasma. Therefore, these processes are excellent for accomplishing highly active sputtering at low gas pressures.

However, the sputtering rate is not very high and the ionization ratio of the particles sputtered from the target is low. Further the energy cannot be controlled in a satisfactory manner because the target is located outside of the plasma generating chamber.

Japanese Patent Application Laid-Open Nos. 61-87869 and 61-194174 disclose apparatuses in which microwave plasma generated under the ECR condition is confined by a mirror magnetic field so that sputtering can be accomplished by high density plasma. In these apparatuses, it is possible to sputter in a high vacuum of from $10^{-4}$ to $10^{-5}$ Torr. However, in the case of the former apparatus (No. 61-87869), since both the target and the substrate are disposed in high density plasma, there arises the problem that high-energy neutral particles and charged particles directly damage the surface of the substrate, resulting in the degradation of the formed thin film. It has the further problem that a mechanism for cooling the surface of the substrate becomes complicated because the temperature rises due to the high density plasma. In the Case of the latter (No. 61-194174) apparatus, the sputtering process is carried out by drawing plasma, which is generated in a mirror magnetic field, by another magnetic apparatus to the surface of the target. In this case, the target is located outside of the plasma generating chamber for generating high density plasma, so that the ionization ratio of the particles sputtered from the target is low and consequently this apparatus is not adapted to forming a thin film by highly reactive ions.

When thin films are formed by sputtering, the following conditions must be satisfied:

(1) A rapid temperature rise should not occur, since this would damage the substrate and the film, and the thin film should be formed at a high rate (that is, high density plasma is required).

(2) The energy of the particles should be controllable over a wide range.

(3) The dispersion of the energy of the particles should be reduced to as small a value as possible.

(4) The ionization ratio of the plasma must be high and the plasma must be active.

(5) Plasma should be generated at a low gas pressure.

So far, a thin film formation apparatus which can satisfy all of the conditions described above has not been realized.

Turning next to ionization apparatuses, such apparatuses may be used as ion sources. Various ion sources utilizing plasma have been widely employed, such as the so-called ion beam sputtering apparatus in which ions are sputtered onto a target, thereby forming thin films, and such as an etching apparatus which is used in the fabrication of integrated circuits. There are many types of ionization apparatuses, such as the Kaufman type, the duoplasmatron type, and so on. Of all the types, the Kaufman type has been most widely used as an ion source. In a Kaufman type ionization apparatus, as shown in FIG. 4, a filament 7 for emitting thermal electrons is mounted in a plasma generating chamber 6 and is used as a negative electrode. The discharge occurs in a magnetic field produced by an electromagnet 8, thereby generating plasma 9. The ions in the plasma are used to produce an ion beam 11 through a plurality of extraction grids 10. Refer to H. R. Kaufman et al.: J. Vac. Sci. Technol., Vol. 21, No. 3, 1982, pp. 725-736. In the Kaufman type ion source, the kinds of gases introduced into the plasma generating chamber 6 to generate ions are limited to inert gases such as Ar, because the filament 7 for emitting thermal electrons is used as an ion source. If a reactive gas were used, it would react with the filament 7, so that stable generation of plasma and extraction of ions would be possible. The apparatus has the further problems that the characteristics drop due to the ageing of the filament 7, maintenance of the source (such as replacement of the filament 7) is cumbersome, and reproducibility is impaired due to variations in the distribution of ion extraction which are caused by the variations in installation of the filament 7. In addition, the filament for emitting the thermal electrons is always exposed to the plasma 9 and the high-energy ions in the plasma impinge on the filament 7. As a consequence, in the extracted particles the material of the filament 7, such as tungsten, is intermixed as an impurity. With the above-mentioned ion source, the ions which can be extracted are limited to the ions of inert gases as described above, and it follows therefore that it is essentially impossible to obtain ions of metals such as aluminum (Al), copper (Cu), iron (Fe) and so on. The same is true for the duoplasmatron type ion source (refer to M. E. Abdelaziz and A. M. Ghander: IEEE Trans. Nucl. Sci., June 1967, pp. 46-52).

When an ion source is used for forming films or etching, it is preferable that the current density of the extracted ion beam be as high as possible. However, in the case of a conventional ion source using a filament, the amount (that is, the number) of ions is dependent upon the amount of electrons emitted from the filament. For this reason it has been essentially impossible so far to make an ion source from which a large amount of ions can be extracted. Furthermore, in the cases of the conventional ion sources, a stable discharge cannot be maintained in the plasma generating chamber at a gas pressure lower than $10^{-3}$ Torr. Therefore, the extracted ions contain a greater proportion of impurities.

U.S. Pat. No. 4,450,031 discloses an apparatus in which, in order to obtain a stable ion beam at a high current, ions are extracted from plasma through an electrode system consisting of a screening electrode and an ion extraction electrode. The plasma is generated by electron cyclotron resonance (ECR) excited by microwaves or by some other method. Japanese Patent Application Laid-Open No. 60-264032 discloses an apparatus in which the ion extraction electrode for extracting the ions from plasma generated by the microwave ECR process is improved. In these ion sources, a high current ion beam can be derived from high density plasma in a stable manner, but the kinds of ions obtained are limited to plasma generation gases, so that it is impossible to obtain ions except gaseous ions. That is, it is impossible to obtain a beam of metal ions.

The conditions required for an ion source may be summarized as follows:

(1) A great amount (i.e., number) of ions should be extracted (high current ions).

(2) Impurities should be excluded as much as possible.

(3) The energy of the ions should be controllable over a wide range.

(4) Not only the ions of inert gases, but also various other ions such as metallic ions, should be available.

However, not even one ion source which can satisfy all of the above-described conditions has been realized yet.

SUMMARY OF THE INVENTION

The present invention was made to overcome the above and other problems encountered in the conventional devices.

An object of the present invention is to provide an ionization apparatus in which high density plasma can be generated in a high vacuum, with the ionization ratio of the plasma being high and the plasma being active and with the apparatus being capable of producing ions from various metals in addition to inert gas ions.

Another object of the present invention is to provide a thin film forming apparatus in which the above-described ionization apparatus is used, with the apparatus being capable of forming thin films at a high rate without causing damage to the film or the substrate due to a rapid temperature rise, and with the energy of the particles being controllable over a wide range and the dispersion of the energy of the particles being reduced as far as possible.

A further object of the present invention is to provide an ion source from which high current ions with reduced impurities can be extracted, with the energy of the ions being controllable over a wide range and with various ions such as metal ions, in addition to inert gas ions, being available for extraction.

In order to achieve these objects, in accordance with a first aspect of the present invention, an ion generation apparatus comprises:

a vacuum chamber consisting of a vacuum waveguide having a microwave introduction window at one end thereof, the microwave introduction window being connected to a microwave waveguide, a plasma generation chamber having a diameter and a length sufficient to define a microwave cavity resonator for causing the resonance of the introduced microwave and an end portion of the plasma generation chamber all connected with each other in the order named and further having a gas introduction inlet;

a target disposed in the plasma generation chamber and supplied with a negative voltage; and at least one pair of magnetic field producing means which are disposed around the vacuum waveguide and the end portion of the plasma generation chamber so that a mirror field is produced in such a way that the center of the magnetic field exists within the plasma generation chamber.

Here, the ion generation apparatus may further comprise at least one pair of second magnetic-field producing means disposed so as to surround the plasma generation chamber in an opposite magnetic polarity relationship so that the magnetic flux leaks to the inner surface of the target.

Each second magnetic field producing means may be a ring-shaped permanent magnet.

Each second magnetic field producing means may alternatively be a magnetic yoke.

Around the vacuum waveguide, a magnetic flux absorbing yoke may be disposed in such a way that the yoke surrounds one of the at least one pair of magnetic flux producing means and is disposed along the vacuum waveguide.

The vacuum waveguide may be connected to the plasma generation chamber in a direction perpendicular to the direction of the magnetic flux.

The vacuum waveguide may have at least one bend and the microwave introduction window may be disposed at a position which cannot be viewed directly from the target.

In accordance with a second aspect of the present invention, a thin film forming apparatus comprises:

a vacuum chamber consisting of a vacuum waveguide having a microwave introduction window at one end thereof, the microwave introduction window being connected to a microwave waveguide, a plasma generation chamber having a diameter and a length sufficient to define a microwave cavity resonator for causing the resonance of the introduced microwave, an end portion of the plasma generation chamber, and a specimen chamber having a substrate holder disposed therein, all of which are connected with each other in the order named, and further having a gas introduction inlet;

a target disposed within the plasma generation chamber and supplied with a negative voltage; and at least one pair of magnetic field producing means disposed so as to surround the vacuum waveguide and the end portion of the plasma generation chamber so that a mirror field is produced in such a way that the center of the magnetic field exists within the plasma generation chamber.

Here, the thin film forming apparatus may further comprise at least one pair of second magnetic field producing means disposed around the plasma generation chamber in opposite magnetic polarity relationship so that the magnetic flux leaks to the inner surface of the target.

Each second magnetic field producing means may be a ring-shaped permanent magnet.

Each second magnetic field producing means may alternatively be a magnetic yoke.

Around the vacuum waveguide, a magnetic flux absorbing yoke may be disposed in such a way that the yoke surrounds one of the magnetic field producing means and is disposed along the vacuum waveguide.

The vacuum waveguide may be connected to the plasma generation chamber in a direction perpendicular to the direction of the magnetic flux produced by the magnetic field producing means.

The vacuum waveguide may have at least one bend and the microwave introduction window may be disposed at a position which cannot be viewed directly from the target.

In accordance with a third aspect of the present invention, an ion source comprises:

a vacuum chamber consisting of a vacuum waveguide having a microwave introduction window at one end thereof, the microwave introduction window being connected to a microwave waveguide, a plasma generation chamber having a diameter and a length sufficient to define a microwave cavity resonator for causing the resonance of the introduced microwave, an end portion of the plasma generation chamber, and a specimen chamber having a substrate holder disposed therein, all of which are connected to each other in the order named, and further having a gas introduction inlet;

a target disposed in plasma generation chamber and supplied with a negative voltage;

at least one pair of magnetic field producing means disposed so as to surround the vacuum waveguide and the end portion of the plasma chamber so that a mirror field is produced in such a way that the center of the magnetic field exists within the plasma chamber; and an ion extraction mechanism which is disposed at the end portion of the plasma generation chamber to selectively extract ions which are obtained by sputtering of the target and are ionized within plasma.

Here, the ion source may further comprise at least one pair of second magnetic field producing means disposed so as to surround the plasma generation chamber in opposite magnetic polarity relationship so that the magnetic flux leaks to the inner surface of the target.

Each second magnetic field producing means may be a ring-shaped permanent magnet.

Each second magnetic field producing means may alternatively be a magnetic yoke.

Around the vacuum waveguide, a magnetic flux absorbing yoke may be disposed in such a way that the yoke surrounds the magnetic field producing means and is disposed along the vacuum waveguide.

The vacuum waveguide may be connected to the plasma generation chamber in a direction perpendicular to the direction of the magnetic flux produced by the magnetic field producing means.

The vacuum waveguide may have at least one bend and the microwave introduction window may be disposed at a position which cannot be viewed directly from the target.

BRIEF DESCRIPTION OF THE DRAWINGS

FIG. 1 is a schematic sectional view showing a conventional two electrode or diode sputtering apparatus;

FIG. 2 is a schematic sectional view showing a conventional three electrode or triode sputtering apparatus;

FIG. 3 is a schematic sectional view showing a conventional magnetron sputtering apparatus;

FIG. 4 is a schematic sectional view showing a conventional Kaufman type ion source;

DESCRIPTION OF THE PREFERRED EMBODIMENTS

Figure 5A:
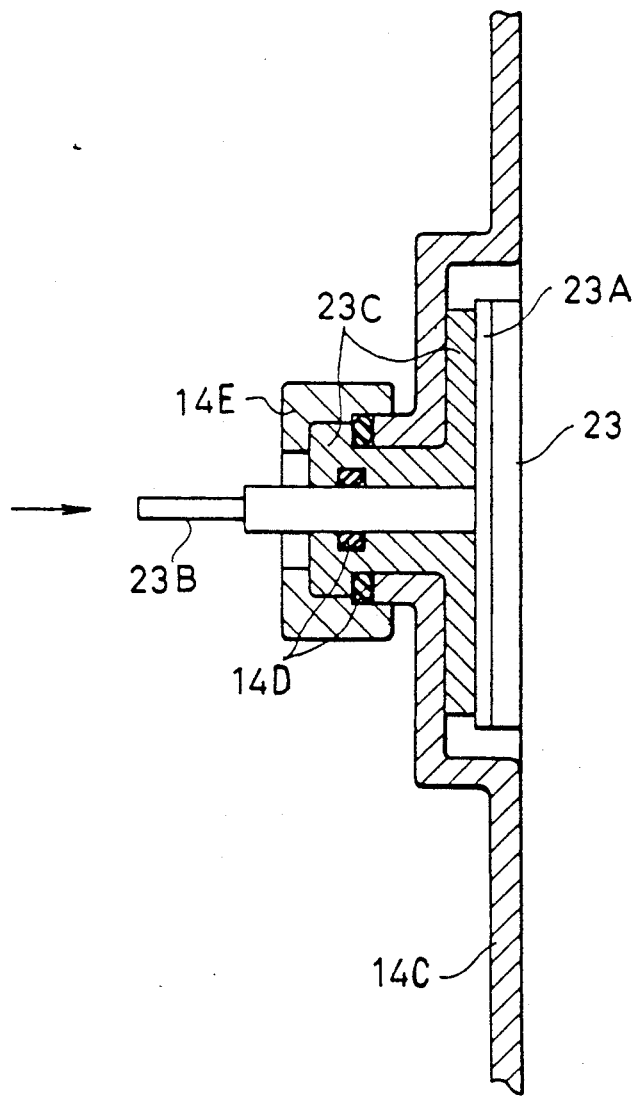
FIG. 5A is a fragmentary view showing a portion of the embodiment of FIG. 5 on an enlarged scale.
Figure 5:
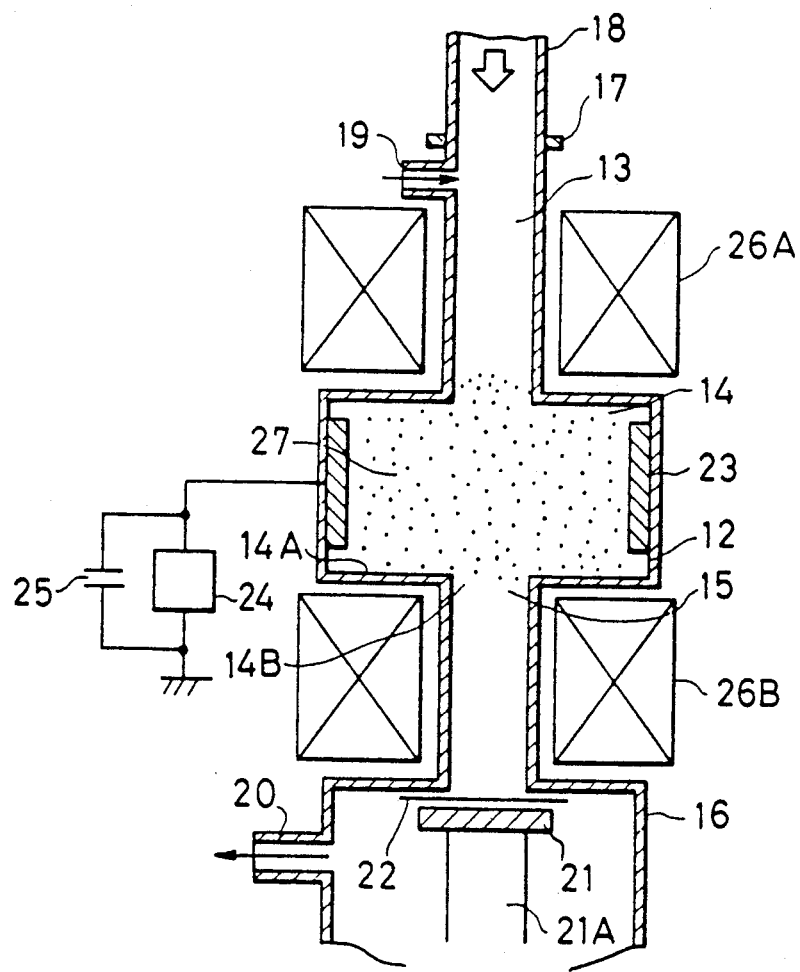
FIG. 5 is a sectional view showing a first embodiment of a thin film forming apparatus in accordance with the present invention.
Figure 6:
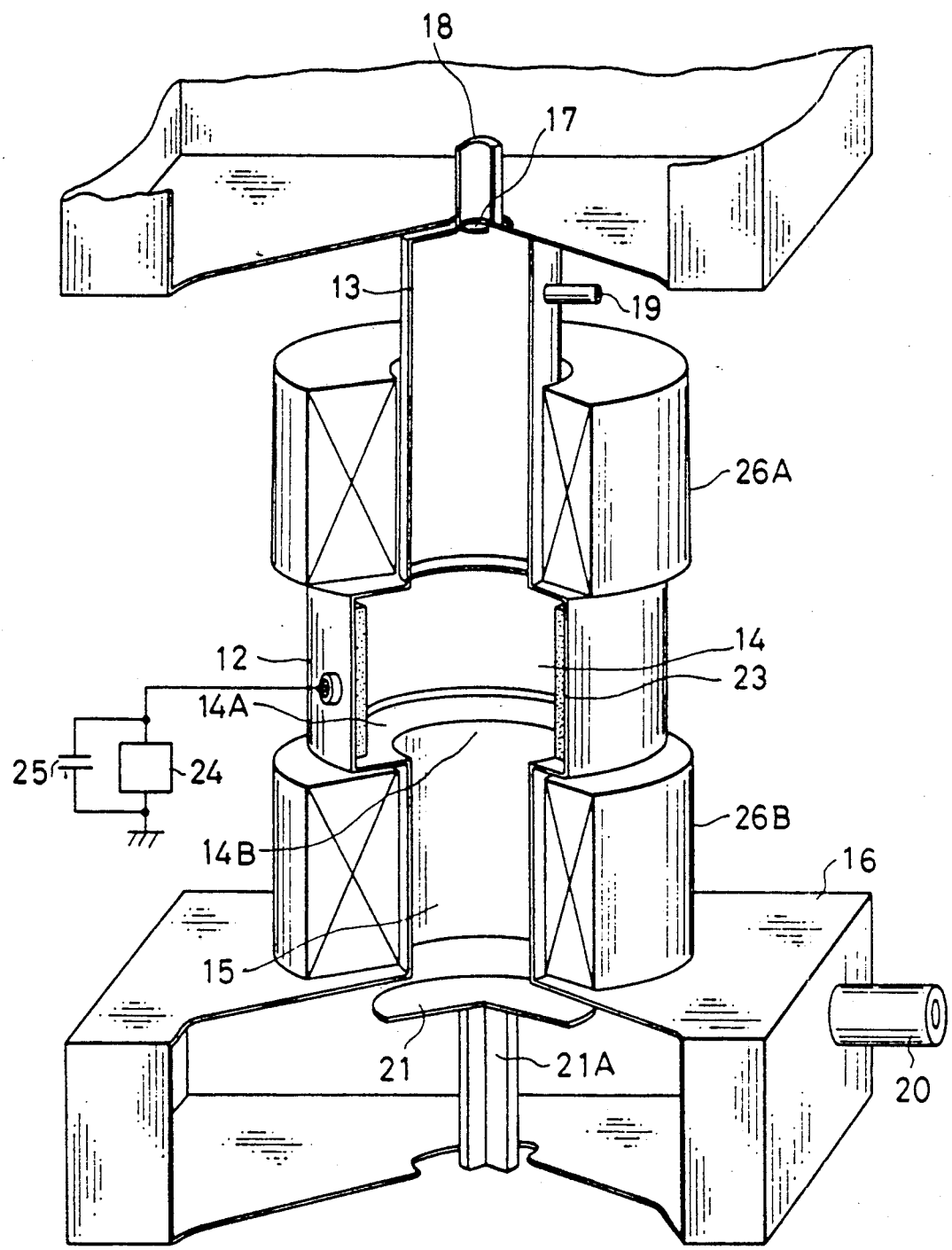
FIG. 6 is a partial cutaway view in perspective showing the first embodiment shown in FIG. 5.

FIG. 5 is a sectional view showing a first embodiment of an ionization apparatus in accordance with the present invention and a thin film forming apparatus utilizing the above-mentioned ionization apparatus. FIG. 5A shows a portion of the embodiment of FIG. 5 on an enlarged scale, and FIG. 6 is a partial cutaway view showing the embodiment of FIG. 5 in perspective. A vacuum chamber 12 made of a non-magnetic material such as stainless steel is composed of a vacuum waveguide 13, a plasma generation chamber 14, an end portion 15 of the plasma generation chamber 14 and a specimen chamber 16. The vacuum chamber 12 is provided with a microwave introduction window 17 and the microwave energy is supplied through a rectangular waveguide 18 from a microwave source connected to a microwave introduction mechanism consisting of a matching device, a microwave power meter, an isolator and so on (not shown). In this embodiment, the microwave introduction window 17 is a quartz glass plate and a magnetron at, for instance, 2.45GHz is used as the microwave source.

The plasma generation chamber 14 is water-cooled in order to prevent the temperature from rising due to the generation of plasma. A plasma generating gas is introduced through an inlet port 19 and the vacuum chamber 12 is evacuated through an outlet or exhaust port 20 by an evacuation device. A substrate 21 is supported by a substrate holder 21A located at the other end in opposing relationship with the microwave introduction window 17. A shutter 22 which is disposed above the substrate 22 can be opened or closed so as to prevent the sputtered particles from impinging on the substrate 21. The substrate holder 21A has a built-in heater which heats the substrate 21. Furthermore, a DC or AC voltage can be applied to the substrate 21 as a bias potential when a thin film is being formed on the substrate or when sputter cleaning of the substrate is being conducted. In FIG. 6, the shutter 22 is not shown.

A microwave cavity resonator is employed for the plasma generation chamber 14, and the cylindrical cavity resonance mode $TE_{113}$ may be used. Chamber 14 consists of a cylinder 20 cm in inner diameter and 20 cm in height so that the electric field strength of the microwave energy can be increased and the efficiency of the microwave discharge can be improved. A cylindrical target 23, which can be water cooled, is attached to a portion of the side surface of the plasma generation chamber 14. A power source 24 can apply a negative voltage up to -1.5 kV and 10 A to the target 23. In this case, the target portion must function as a part of the resonator for the microwave energy, and for this reason the target 23 is grounded through a capacitor 25 having a high electrostatic capacity. As shown in FIG. 5A, the target 23 is connected to a terminal 23B through a packing plate 23A which is incorporated with the target 23 and is electrically and thermally conductive and has such a construction that cooling water circulates therein. The target 23 is electrically insulated from the side wall 14C of the plasma generation chamber 14 by an insulator 23C. The vacuum state in the plasma generation chamber 14 is maintained by vacuum-tight O rings 14D and a screw cap 14E. In FIG. 6, the packing plate 23A as well as the insulator 23C is not shown. Furthermore, in all the embodiments to be described hereinafter, they are not illustrated in detail because the disposition of the target within the plasma generation chamber is substantially similar to that in this embodiment. The lower end of the plasma generation chamber 14, that is, the surface 14A connected to the end portion 15 of the plasma chamber 14, is formed with a hole 14B 10 cm in inner diameter. The surface 14A serves as a reflection surface for the microwave energy, and as a result the plasma chamber 14 functions as a cavity resonator.

Electromagnets 26A and 26B are fitted over the plasma generation chamber 14 at both the upper and lower ends thereof. The intensity of the magnetic fields produced by the electromagnets 26A and 26B is so controlled that the conditions for causing electron cyclotron resonance due to the microwave energy can be established within the plasma generation chamber 14. For instance, the condition for causing electron cyclotron resonance of the microwave energy at a frequency of 2.45GHz is a magnetic flux density of 875G, and accordingly both of the electromagnets 26A and 26B are so designed and constructed that a maximum magnetic flux density of 3000G can be obtained. When the electromagnets 26A and 26B are spaced apart from each other by a suitable distance so that the magnetic flux density within the plasma chamber 14 is reduced to a minimum or when the so-called mirror magnetic field arrangement is established, the electrons can efficiently receive energy due to the electron cyclotron resonance. Furthermore scattering of the generated ions and electrons in a direction perpendicular to the magnetic field can be prevented and the plasma 27 can be confined within the mirror field.

Figure 7:
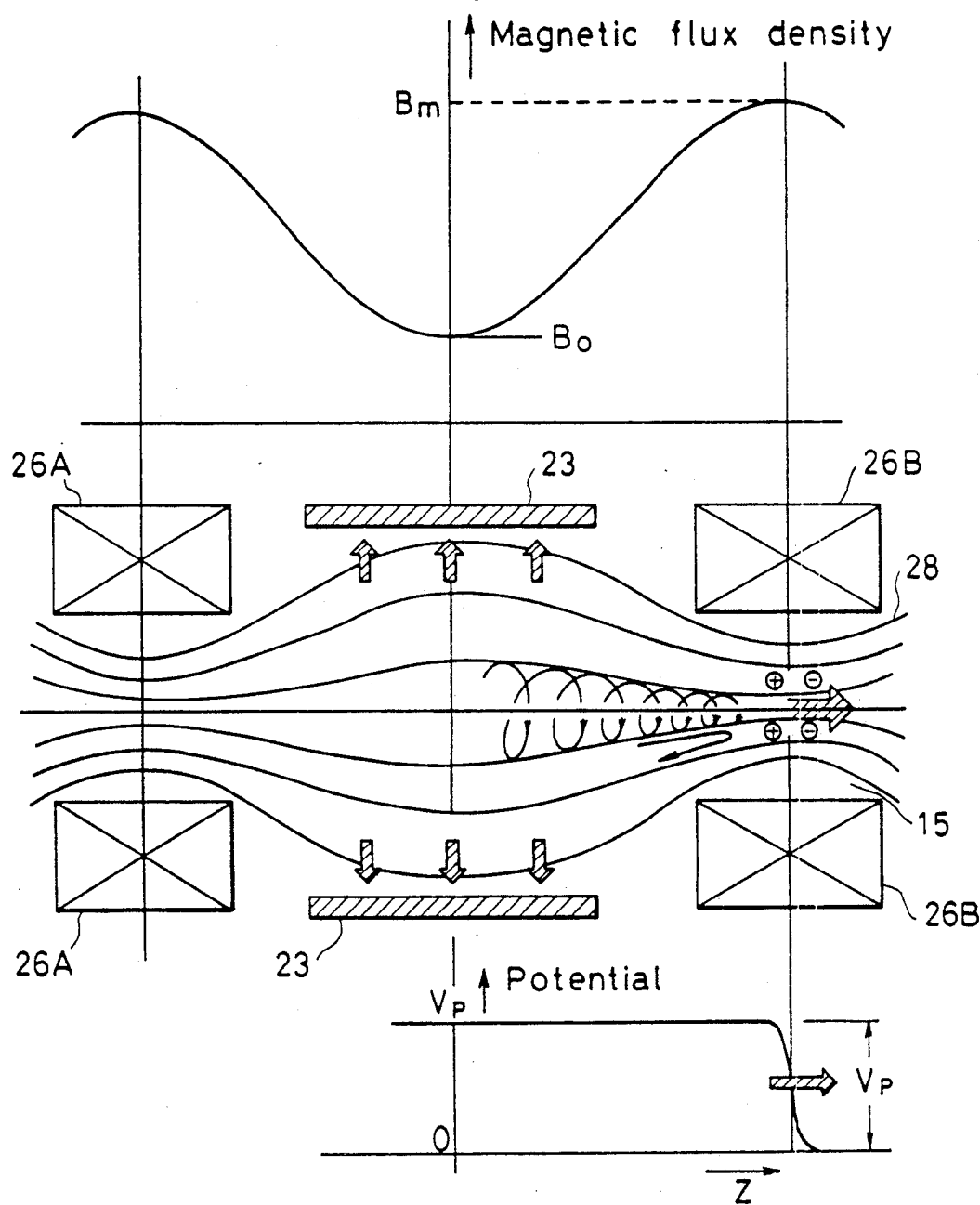
FIG. 7 is a diagram illustrating the magnetic field, motion of ions and the potential distribution in the first embodiment shown in FIG. 5.

In FIG. 7, which illustrates the underlying principle of the present invention, the same reference numerals are used to designate parts similar to those shown in FIG. 5. The parameters in the case of generating plasma are the gas pressure in the plasma generation chamber, the microwave power, the voltage applied to the target, the gradient of the mirror magnetic field (the ratio $Bm/Bo$ between the maximum magnetic flux density $Bm$ of the electromagnet assembly and the minimum magnetic flux density $Bo$ within the plasma generation chamber at the axis of the electromagnets 26A and 6B), the distance between the electromagnets and so on. For instance, in the case of microwave energy at a frequency of 2.45GHz, the minimum magnetic flux density $Bo$ is determined at 875G while the maximum magnetic flux density $Bm$ at the midpoint of each electromagnet can be varied from 1 kG to 3 kG so that the gradient of the magnetic field can be varied. When the magnetic field is gradually varied in space, the charged particles in the plasma are constrained by the lines of magnetic force 28, make a spiral movement around the lines of magnetic force 28, and are reflected at a portion of high magnetic flux density while maintaining their angular momentum. As a result the charged particles reciprocate within the mirror magnetic field and are confined. The above-mentioned gradient of the mirror magnetic field, or $Bm/Bo$, greatly influences the plasma confinement efficiency. When a negative voltage is applied to the target facing the high density plasma thus confined, the ions in the high density plasma can be efficiently extracted to the target 23, causing sputtering. In addition, a portion of almost all neutral particles sputtered from the target 23 is ionized in the high density plasma, which has high electron temperatures. The electrons are far lighter than the ions, so that the speed of the electrons in the direction of the lines of the magnetic force is faster than that of the ions. As a result, many electrons escape from the ends of the mirror while positive ions remain in the mirror. Therefore a charge separation occurs and consequently an electric field is induced in the vicinity of the ends. When the potential difference (Vp) between the outside and the inside of the plasma generation chamber becomes equal to the average energy of the electrons, equilibrium is attained and this electric field causes the deceleration of the electrons while causing the acceleration of the ions. Thus, electrons and ions are emitted in the same amount. When the plasma is considered from the standpoint of the thin film forming apparatus, the losses due to the space charge effect by the mirror mean that ions having an energy equivalent to the voltage difference can be obtained from the plasma. This energy is greatly dependent on the microwave power and the gas pressure and can be controlled freely over a wide range, from several electron volts to hundreds of electron volts.

Meanwhile, a portion of the neutral particles sputtered from the target 23 is directly deposited over the substrate 21. These particles are particles which moved in the direction of the substrate 21 and which did not collide with other particles during their movement. Furthermore, sputtered atoms or molecules consisting of the target material lose their kinetic energy while reciprocating in the plasma and finally diffuse out to the outside of the plasma by crossing the lines of magnetic force. The diffused neutral particles are deposited on the surface of the substrate, thereby forming a thin film. As described above, the target and the substrate ar located at positions perpendicular to each other, so that bombardment of the substrate by negative ions from the target and high-energy Ar neutral particles, which are a few percent of the sputtered neutral particles, can be avoided. As a consequence, the problem encountered in the conventional sputtering processes, that the substrate is bombarded by various high-energy particles, can be prevented.

In addition, particles are scattered due to collisions of the particles in the plasma, and the relaxation time of the decrease in the plasma density due to the collisions and scattering of the particles becomes shorter as the energy of the ions in the plasma becomes lower. Therefore, the average energy of the particles escaping from the ends of the mirror becomes only a fraction of the average energy of the particles within the plasma. In other words, this means that the ionization in the plasma is carried out at high-energy (in a highly active mode), and when the ions thus obtained are extracted from the plasma to form a film, the ions can be extracted at a lower energy which is a fraction of the average energy described above. This shows that a sputtering apparatus with the above-described magnetic field distribution has very desirable properties when used as a thin film forming apparatus.

According to the present invention, since the plasma is activated a stable discharge can be maintained at a relatively low gas pressure ($10^{-5}$ Torr) and a film containing relatively few impurities can be formed.

Furthermore, according to the present invention, heating due to the electron cyclotron resonance is utilized, so that the electron temperature in the plasma can be freely controlled. Therefore, the electron temperature can be increased to such an extent that highly charged ions can be produced. Accordingly, the present invention has the remarkable feature that materials which are chemically unstable can be synthesized by utilizing the highly charged ions.

For a thin film forming apparatus in accordance with the present invention, the ionization ratio in the plasma is remarkably high, as described above. The sputtered neutral particles emitted from the target are ionized at a high rate in the plasma and the ionized particles which had constituted the target ar accelerated by the potential of the target. As a consequence, the so-called self-sputtering rate, that is, the rate at which the target is sputtered by these accelerated ionized particles, is increased considerably. Even when an extremely thin plasma generation gas (for instance, Ar) is used, or even if no plasma generating gas is used at all, the above-described self-sputtering continues, and consequently the present invention has the marked feature that a film of an extreme purity can be formed.

Next, the results of experiments in which Al films were formed by the thin film forming apparatus in accordance with the present invention will be described.

The specimen chamber 16 was first evacuated to a vacuum on the order of $5 \times 10^{-7}$ Torr and then Ar gas was introduced into the chamber 16 until a pressure on the order of $3 \times 10^{-4}$ Torr was reached. Thereafter, films were formed under the following conditions: The microwave power was 100 - 800 W, the voltage applied to the Al target was $-300$ V to $-1$ kV, and the gradient of the mirror magnetic field was maintained at 2 kG/875 G. The substrate holder 21A was disposed at the lower end of the lower mirror coil 26B and the sputtering process was started at room temperature without heating the substrate 21. The film formation rate increased as the microwave power and the voltage applied to the target were increased, and was 250 Å/min when the microwave power was 300 W and the negative voltage applied to the target 23 was $-800$ V. When the microwave power and the voltage applied to the target 23 were varied within the above-described ranges, respectively, the thin films were formed efficiently at a deposition rate of 100–2000 Å/min. As compared with the thin films formed by the conventional sputtering techniques, the internal stresses in the thin films were low, and as a result thin films more than 2 μm in thickness could be formed in a stable manner without causing cracking and separations.

In this case, the average energy cf the ions varied between 5 eV and 25 eV, and of all the particles emitted in the direction of the substrate, the ratio of the ions was between 10 and 30%.

Using a thin film formation apparatus in accordance with the present invention, not only Al films, but also almost all other desired thin films, can be obtained. Furthermore, when a reactive gas is introduced into the process chamber, reaction sputtering can be realized.

Figure 8:
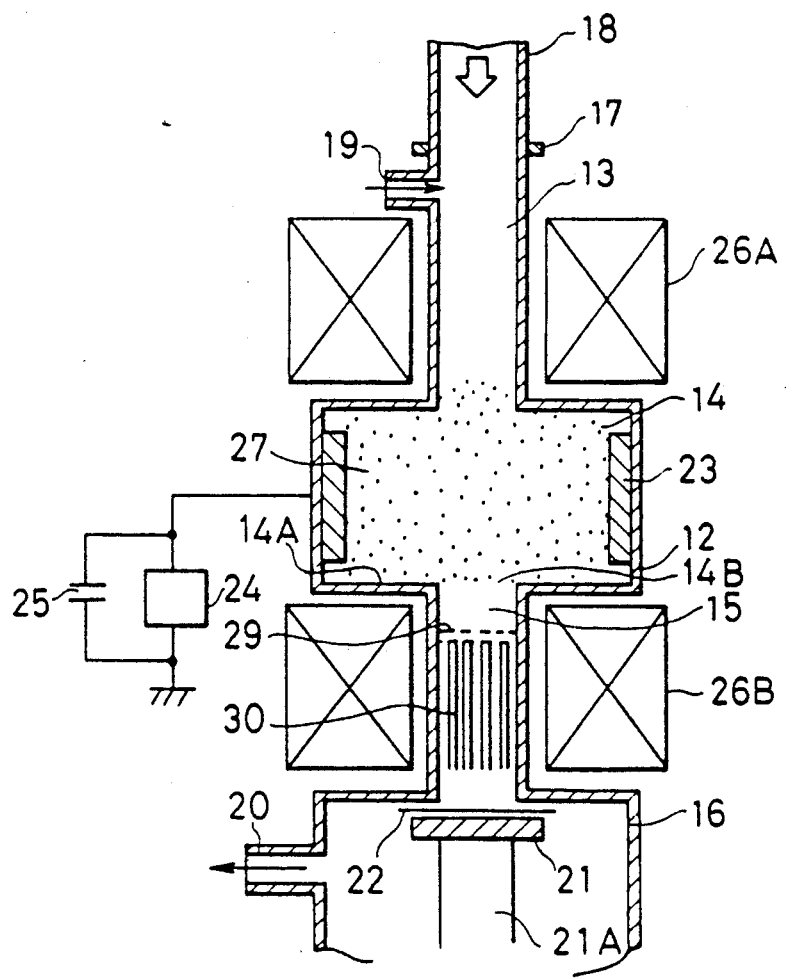
FIGS. 8 and 9 are a sectional view and a partial cutaway view in perspective showing a first embodiment of an ion source in accordance with the present invention, respectively.
Figure 9:
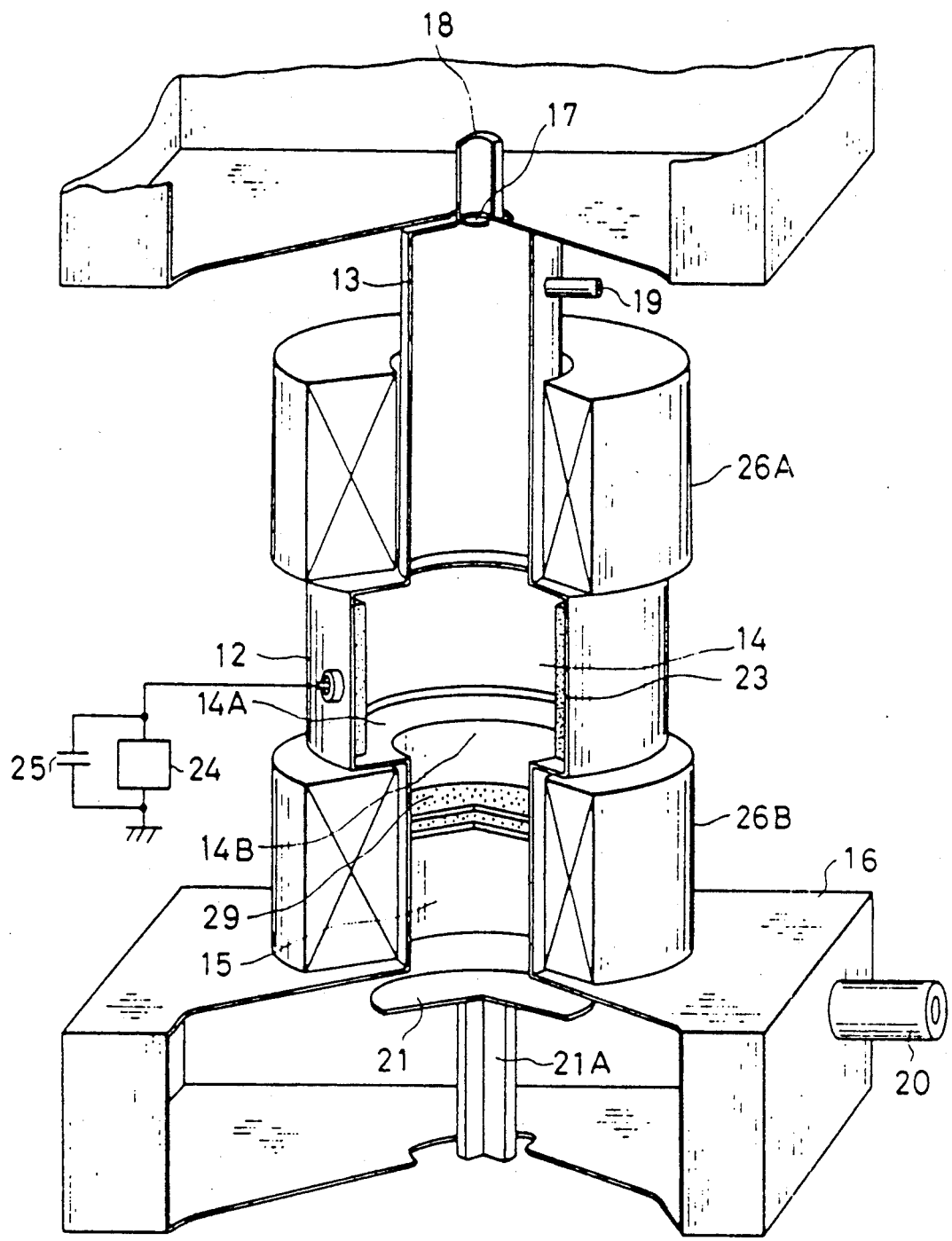

The devices as shown in FIGS. 5 and 6, that is, the ion generation apparatus utilizing a high density plasma sputtering, can be also used as an ion source. FIG. 8 is a sectional view of an embodiment of the ion source while FIG. 9 is a partial cutaway perspective view. The same reference numerals used in FIGS. 5 and 6 are also used to designate similar parts in FIGS. 8 and 9. The main differences between this embodiment and the apparatus shown in FIGS. 5 and 6 reside in the fact that an ion extraction grid 29 is disposed within the end portion 15 of the plasma generation chamber 14. In this embodiment, the bottom surface 14A of the plasma generation chamber 14 is formed with a hole 10cm in diameter and functions as a reflecting surface for the microwaves. The plasma generation chamber 14 functions as a cavity resonator. The grid surface is disposed in opposing relationship with the microwave introduction window 17 and also functions as a reflecting surface of the microwaves, so that the efficiency of the microwave discharge is increased.

In this embodiment, the confinement of the plasma, the sputtering of the target 23, and the ionization of the sputtered particles are substantially similar to what was described above with reference to the previous embodiment, and a large number of ions from the atoms or molecules of the material that had constituted the target are generated in the high density plasma. These ions are extracted through the grid 29 as high current ion beams 30. The energy of the ions thus extracted can be controlled between several electron volts and dozens of kilo electron volts by controlling the voltage applied to the grid 29. A great number or amount of ions having a suitable level of energy can be extracted and almost all the particles thus extracted are ionized.

Furthermore, in the apparatus of the present invention, the ionization is carried out by the sputtering technique utilizing high density plasma, so that various metal ions and the ions of various chemical compounds can be obtained at an extremely high current density. Therefore, the above-described apparatus in accordance with the present invention exhibits excellent performance when it is used as an ion source for forming various thin films or for etching.

In addition, according to the present invention, the plasma is an active plasma, so that the discharge can be accomplished in a stable manner at a relatively low gas pressure ($10^{-5}$ Torr). Therefore, the present invention has a feature that the ions with relatively few impurities can be extracted.

Furthermore, the present invention utilizes heating by the electron cyclotron resonance phenomenon, so that the temperature of the electrons in the plasma can be freely controlled. Therefore, the electron temperature can be raised to such an extent that highly charged ions can be generated. Thus, the present invention has the further feature that highly charged ions can be extracted to synthesize compounds which are chemically unstable.

Since the ionization ratio in the plasma is extremely high for an ion source in accordance with the present invention, as described above, the ratio of the ionization in the plasma of the sputtered neutral particles emitted from the target is high. These ionized particles, which had constituted target, are accelerated due to the potential applied to the target so that they sputter the target again. In other words, the so-called self-sputtering ratio is extremely increased. Even if a very thin plasma generation gas (for instance, Ar) is employed, or if no plasma generation gas is used at all, the above-described self-sputtering continues. Therefore the present invention has the further feature that ions with a high degree of purity can be extracted and a thin film can be formed with these ions.

Next, the results of experiments in which Al films were formed by the apparatus of the present invention will be described. After the plasma generation chamber 14 had been evacuated to a vacuum on the order of $5 \times 10^{-7}$ Torr, Ar gas was introduced until the gas pressure in the plasma generation chamber 14 become $3 \times 10^{-4}$ Torr. When the microwave power was 300 W, the voltage applied to the Al target was $-800$ V, the gradient of the mirror field was maintained at 2kG/875G, and a voltage of $-70$V was applied to the ion extraction grid 29, an Al film was formed at the deposition rate of 70 Å/min. When the microwave power was between 100 and 800 W, the voltage applied to the target was $-300$ V to $-1$kV, and the gradient of the mirror field was maintained at 2kG/875G, aluminum ions (Al+) having energy ranging from 20 eV to 100 eV were extracted, and a film was formed efficiently at the deposition rate of from 50 to 1000 Å/min.

An ion source in accordance with the present invention can be used not only for forming aluminum films, but also for almost all other types of films and for etching thereof. Furthermore, if a reactive gas is introduced into the plasma generation chamber 14, deposition of a compound due to the ion beam can be realized.

Figure 10:
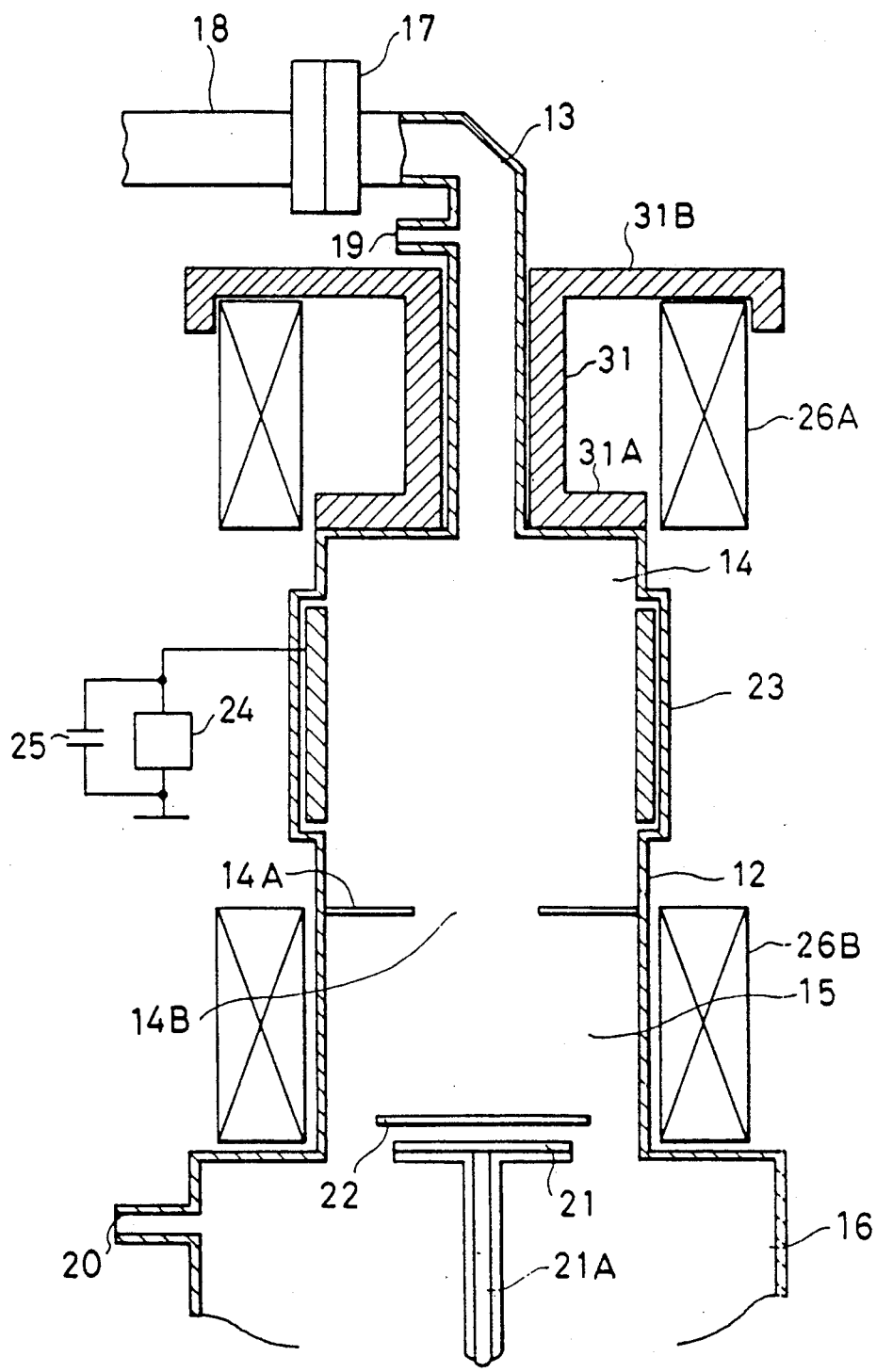
FIG. 10 is a sectional view showing a second embodiment of a thin film forming apparatus in accordance with the present invention.

FIG. 10 is a sectional view showing another embodiment of a thin film forming apparatus in accordance with the present invention. When the thin film forming apparatus as shown in FIGS. 5 and 6 is used to deposit a thin film of material such as a metal or an electrically conductive material, the film is deposited not only over the substrate 21 but also the microwave introduction window 17 made of quartz or the like. Therefore the microwave energy for generating the plasma is reflected back from the microwave introduction window 17 and it becomes difficult to generate the plasma. As a result, in the case of the apparatus shown in FIG. 5 or 6, an electrically conductive film cannot be formed in a stable manner for a long period of time, and the materials to be used and the thickness of the film are limited. The FIG. 10 embodiment is intended for resolving the above described problem. In this embodiment, a yoke 31 is made of, for instance, a soft magnetic iron. Yoke 31 is disposed around the vacuum waveguide 13 in order to absorb the magnetic flux produced by the electromagnet 26A, and is arranged in such a way that a valley in the magnetic field is defined within the plasma generation chamber 14 and the intensity of the magnetic field within the vacuum waveguide 13 is reduced. The vacuum waveguide 13 itself may be made with a suitable yoke material. In addition, in order to define the distribution of the magnetic field produced by the yoke 31 within the plasma generation chamber 14 as uniformly as possible, a portion 31A opposite the top surface of the plasma generation chamber 14 is enlarged as much as possible. Furthermore, the other end 31B of the yoke 31 surrounds the upper end of the electromagnet 26A and absorbs the magnetic flux, so that the magnetic resistance of the electromagnet 26A itself is reduced and a high degree of yoke effect is attained. In this embodiment, the vacuum waveguide 13 is in the form of an L and the microwave introduction window 17 is disposed at a position which cannot be directly viewed from the cylindrical target 23 mounted in the plasma generation chamber 14. The rest of the construction is substantially similar to that described above in conjunction with FIG. 5.

Figure 11:
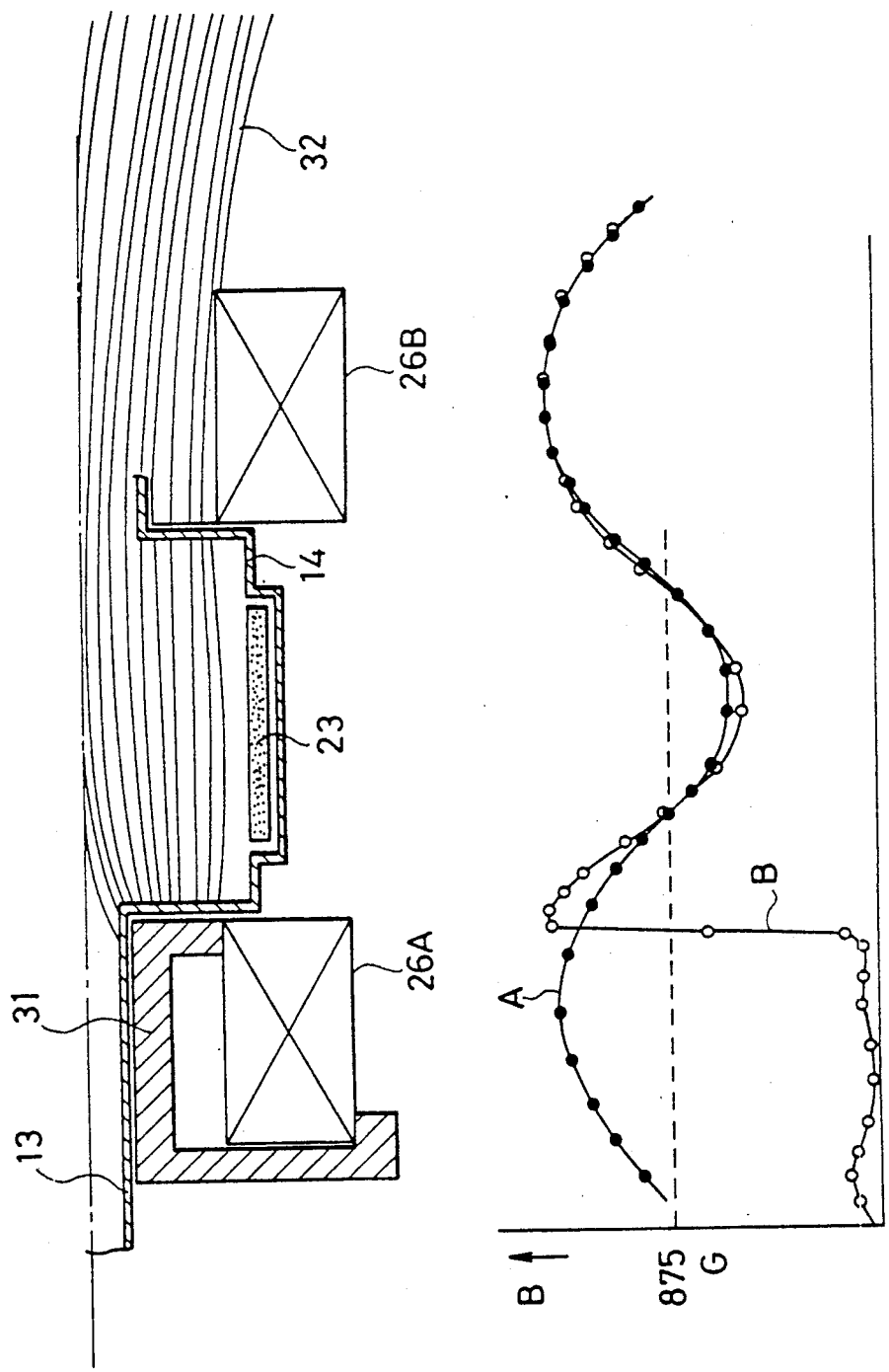
FIG. 11 is a diagram illustrating a distribution of the intensity of the magnetic field in the direction of the magnetic flux in the second embodiment shown in FIG. 10.

As in the case of the embodiment shown in FIGS. 5 and 6, one or more electromagnet pairs 26A and 26B are disposed at both ends of the plasma generation chamber 14 so that a valley in the intensity of the magnetic field produced by the electromagnets 26A and 26B is defined in the plasma chamber 14. The conditions for attaining electron cyclotron resonance (ECR) in the plasma generation chamber 14 must be satisfied. Because of ECR, energy is efficiently imparted to the electrons, and as a result high density plasma can be produced at a low gas pressure in the plasma generation chamber 14. The vacuum waveguide 13, which is disposed on the upstream of the microwave generation chamber, is surrounded by the magnetic flux absorbing yoke 31, so that the magnetic field changes abruptly in intensity at the boundary between the vacuum waveguide 13 and the plasma generation chamber 14. FIG. 11 shows an example of the distribution of the intensity of the magnetic field in the direction of the magnetic flux in this embodiment. In FIG. 11, the curve A shows the magnetic field distribution when the vacuum waveguide 13 is not surrounded with the yoke 31, while curve B illustrates the distribution of the magnetic field when the vacuum waveguide 13 is surrounded by the yoke 31.

A cylindrical target 23 is attached to the cylindrical inner wall surface of the plasma generation chamber 14 in such a way that it surrounds the plasma, or one or more flat targets may be attached to the inner wall of the plasma generation chamber 14 so as to face to the plasma.

Figure 12:
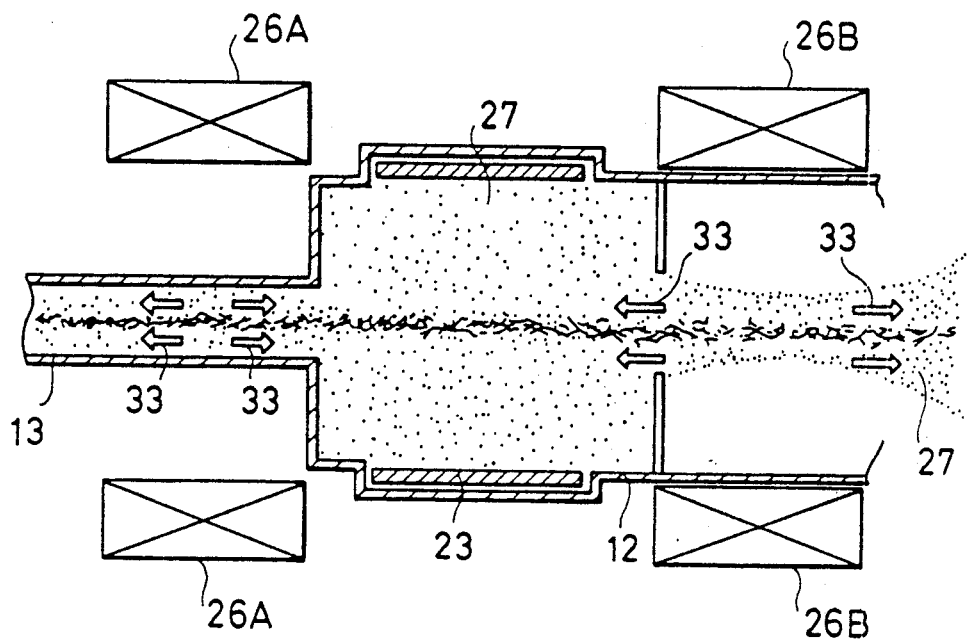
FIGS. 12 and 13 are diagrams illustrating the states of the generated plasma with and without a yoke, respectively.
Figure 13:
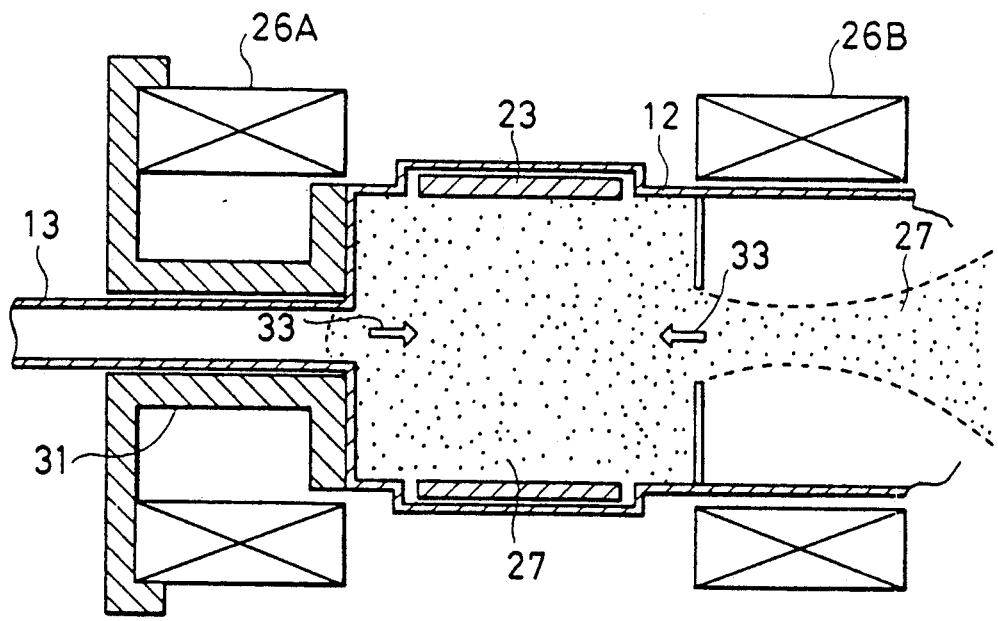

FIG. 12 shows the plasma generation mode and the directions of acceleration of the generated plasma when no yoke 31 is used, while FIG. 13 shows the plasma generation mode and the directions in which the generated plasma is accelerated when yoke 31 is used. The relevant parameters for generation of plasma are the gas pressure in the plasma generation chamber, the microwave power, the power applied to the target, the gradient of the magnetic field, and so on. If microwave energy at a frequency of 2.45GHz is used, it suffices that a magnetic flux density of 875G, which is one of the conditions for producing the resonance as described above, is attained within the plasma generation chamber 14 and that the gradient of the mirror field is such that the intensity of the magnetic field has a valley within the plasma generation chamber 14. When the magnetic field is gradually varied in space as described above, the electrons produced in a high density plasma have a far higher mobility than that of the ions. The electrons are accelerated toward the center portion of the plasma generation chamber 14 while being constrained by the magnetic flux lines 32 so as to make spiral movements around the magnetic flux lines without losing angular momentum. As a result, the charged particles in the plasma generation chamber 14 are caused to reciprocate in the valley of the magnetic field and heating of the electrons and ionization of the particles are promoted because of this reciprocating motion. However the electrons, having a high degree of mobility, lose their energy gradually and leak at the ends of the plasma chamber 14 in the direction of the magnetic flux, so that only the positive ions remain in the plasma an electric field is induced by this charge separation. The electric field thus induced causes the positive ions in the plasma to accelerate in the direction of the substrate 21. In practice, the independent behavior of the electrons and the ions destroys the neutrality of the plasma and they cannot behave so indefinitely. Equilibrium is attained when the difference in potential between the surface of the substrate 21 and the plasma becomes equivalent to the average energy of the electrons, and this electric field acts as a deceleration field for the electrons but as an acceleration field for the ions. As a result the so-called ambipolar diffusion mode in which the amounts of electrons and ions emitted become substantially equal to each other is attained. As a consequence, ions having a relatively low energy between several electron volts and several tens of electron volts can be extracts. Furthermore, when a negative voltage is applied to the target 23 disposed in opposing relationship with the high density plasma generated by ECR, the ions in the high density plasma can be efficiently extracted so that sputtering can be carried out. The sputtered target material is extracted in the manner described above and a thin film can be formed on the substrate 21.

When an electrically conductive film is formed, the microwave introduction window I7 of the apparatus shown in FIG. 5 becomes dim because of the material deposited on it, and microwaves are reflected from the dim window. As a result plasma cannot be produced over a long period of time. Therefore, in order to prevent this one might consider disposing the microwave introduction window 17 at a position spaced apart from the plasma generation chamber 14 and providing a connection through the vacuum waveguide 13. However, as indicated by the curve A in FIG. 11, when only the vacuum waveguide 13 is used, without being surrounded by the yoke 31, a magnetic flux density which satisfies ECR conditions is attained within the vacuum waveguide 13 and plasma is generated therein. As a result, the microwave power can not be supplied to the plasma chamber 14 effectively and non-uniform plasma is generated. Concurrently, since a diverging magnetic field is produced in the direction from the vacuum waveguide 13 to the microwave introduction window, the plasma 27 is accelerated not only in the direction of the substrate 21 but also in the direction of the microwave introduction window. On the other hand, as indicated by the curve B in FIG. 11, when the vacuum waveguide 13 is surrounded with the yoke 31, plasma is not produced in the vacuum waveguide and an abrupt variation in the intensity of magnetic field exists between the vacuum waveguide 13 and the plasma generation chamber 14. As a result the plasma is not accelerated in the direction of the microwave introduction window I7. Of the particles sputtered from the cylindrical target 23, the particles which are not ionized and therefore neutral are not affected by the magnetic field and the electric field. These neutral particles travel straight from the target 23. However, the microwave introduction window 17 is disposed at a position which can not be directly viewed from the target 23. That is, the position of window I7 is past an obstacle upon which particles flying straight from the target 21 will inevitably impinge, so that the microwave introduction window 17 is prevented from becoming dim with the sputtered particles even if the sputtering process is carried out for a long period of time. Furthermore, films of almost any material can be continuously formed for a long period of time in a stable manner regardless of the electric conductivity and the thickness of the film being formed.

In addition, when the yoke 31 is considered as a component part of the magnetic circuit of the electromagnet 26, the yoke 31 has the effect of decreasing the magnetic resistance of the electromagnet 26A itself. Thus, this embodiment has the important practical feature that the value of the current which needs to flow through the electromagnet 26A for attaining the magnetic flux density required for ECR is by far lower than the value of the current flow needed through an electromagnet 26A which is not provided or surrounded by the yoke 31.

By using the apparatus of this embodiment under the same conditions as those described above with reference to FIG. 5, an Al film could be deposited at the deposition rate of 100–800 Å/min for a long period of time in a stable and efficient manner. It should be noted here that in the case of the embodiment shown in FIG. 5, the magnitude of the current flowing through the electromagnet was on the order of 28 A, but in this apparatus, a current on the order of 16 A was sufficient because of the effect of the yoke 31. In this case, the average energy of the ions could be varied from 5 eV to 30 eV.

Figure 14:
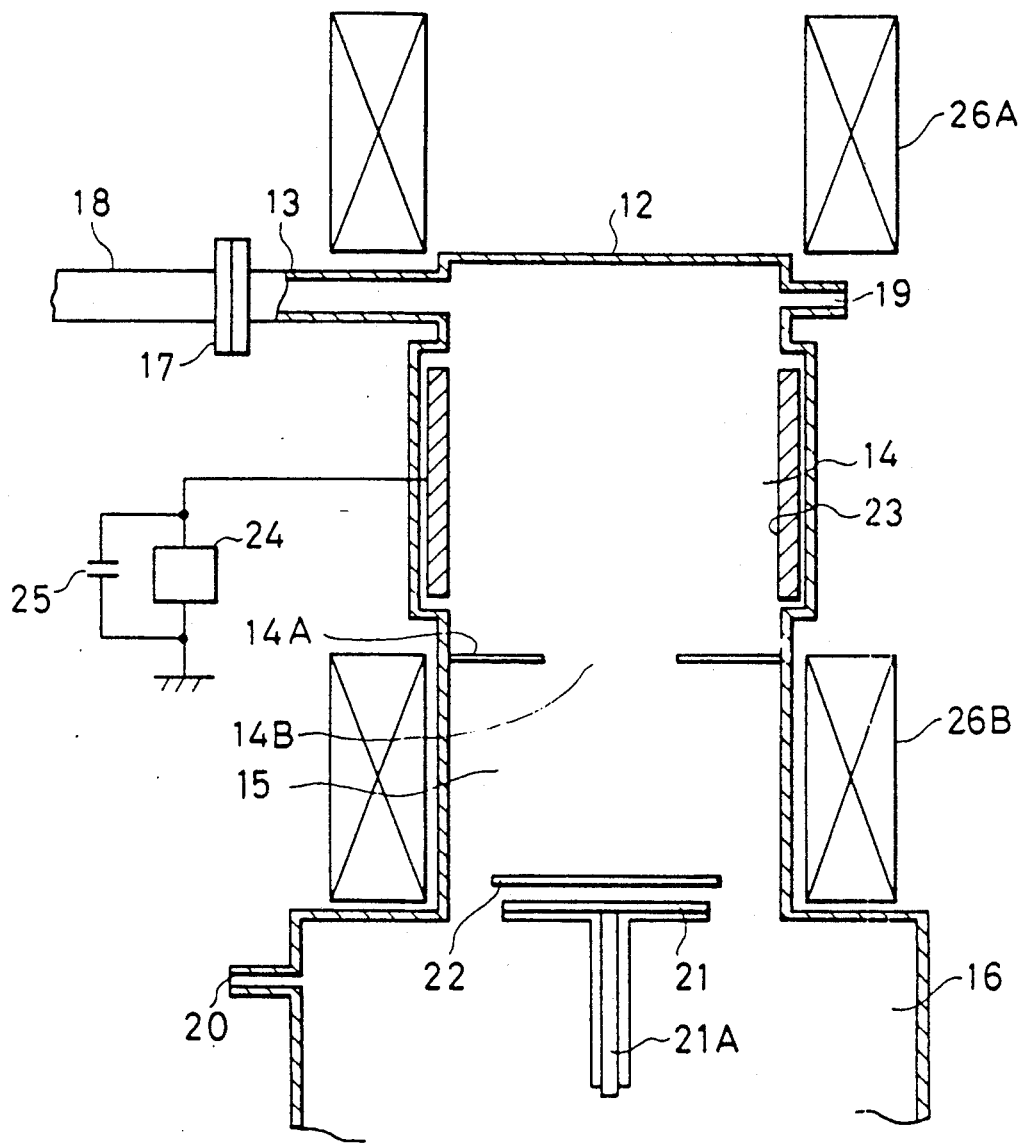
FIG. 14 is a sectional view showing a third embodiment of a thin film forming apparatus in accordance with the present invention.

FIG. 14 shows a third embodiment of a thin film forming apparatus in accordance with the present invention.

Figure 16:
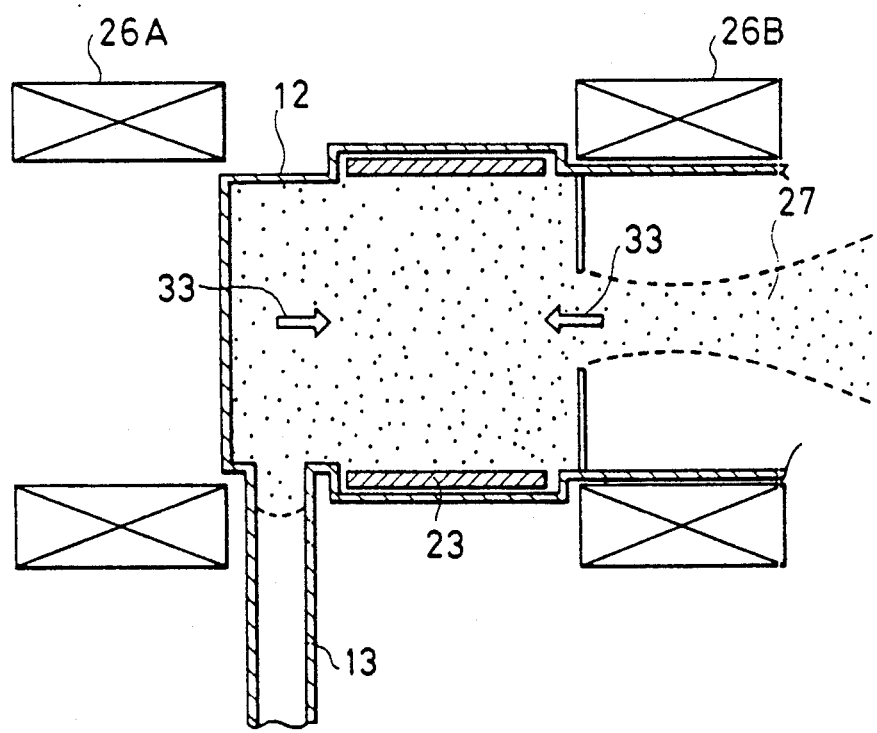

In this embodiment, the vacuum waveguide 13 is connected to the plasma generation chamber 14 perpendicular to the magnetic flux produced by the magnets 26A and 26B. The microwave introduction window 17 is made of a quartz plate and is disposed at a position which cannot be directly viewed from the target 23 mounted in the plasma generation chamber 14. The rest of the construction is substantially similar to that of the embodiment described above with reference to FIGS. 5 and 6. FIG. 16 shows the plasma production mode and the acceleration directions 33 of the plasma.

As is indicated by FIG. 12, when the vacuum waveguide 13 is connected to the plasma generation chamber 14 in parallel with the magnetic flux produced by the magnets 26A and 26B, a diverging magnetic field is formed in the direction of the introduction of the microwave energy through the vacuum waveguide 13. As a result, plasma is accelerated not only in the direction of the substrate, but also in the direction of the microwave introduction window. On the other hand, if the vacuum waveguide 13 were connected to the plasma generation chamber 14 perpendicular to the magnetic flux, the plasma would not cross or transverse the magnetic flux and would not diverge, so that the plasma would not be accelerated in the direction of the microwave introduction window. Furthermore, of the particles sputtered from the cylindrical target 23 mounted in the plasma generation chamber 14, the neutral particles would not be effected by the magnetic and electric fields, but would travel or fly substantially straight from the target. Therefore, by disposing the microwave introduction window 17 at a position which cannot be directly viewed from the target 23 as described above, the microwave introduction window 17 can be prevented from becoming dim by the sputtered particles. It follows therefore that it is preferable to form at least one bend in the vacuum waveguide 13. Thus, by utilizing this embodiment, films of almost any material can be formed continuously for a long period of time and in a stable manner regardless of the electric conductivity of a film being grown and the thickness thereof, without the microwave introduction window 17 to become dim.

Next, the results of experiments in which Al films were formed by this embodiment will be described. First the specimen chamber 16 was evacuated to $5\times10^{-7}$ Torr and then Ar gas was introduced at a flow rate of 5cc/min until the gas pressure in the plasma chamber 14 become $5\times10^{-4}$ Torr. Thereafter, with the microwave power being between 100 and 500 W, and the power applied to the cylindrical Al target 23 being between 300 and 600 W, films were formed at a gradient of the mirror field. The substrate holder was not heated and the film formation was carried out at room temperature. Under these conditions, Al films can be deposited at a rate of deposition of 100-800 Å/min continuously for a long period of time in a stable and efficient manner.

Figure 17:
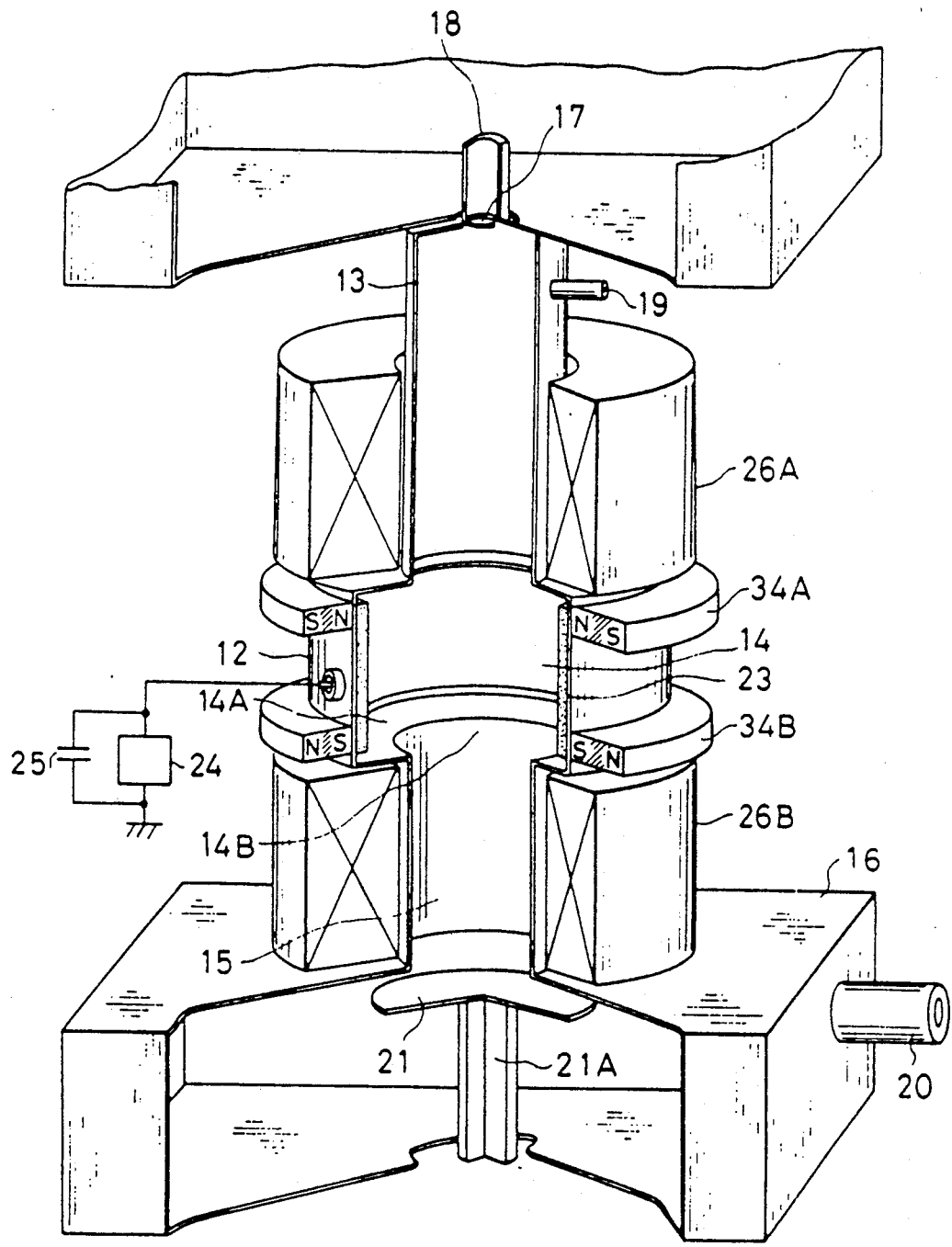
FIG. 17 is a partial cutaway view in perspective showing a fourth embodiment of a thin film forming apparatus in accordance with the present invention.

Referring next to FIG. 17, a fourth embodiment of a thin film forming apparatus in accordance with the present invention will be described. In this embodiment, at least one pair of ring-shaped permanent magnets 34A and 34B are disposed around the plasma generation chamber 14 at positions corresponding to the upper and lower ends of the cylindrical target 23. The polarities of the magnets 34A and 34B are in opposed relationship with each other so that the magnetic flux will leak to the inner surface of the cylindrical target 23. The rest of the construction is substantially similar to the embodiment described above with reference to FIG. 6. In FIG. 17, a shutter disposed above the substrate 21 is not shown for the sake of simplicity.

In this embodiment, the plasma is confined in a manner substantially similar to that described above in conjunction with FIGS. 5 and 6. When a negative voltage is applied to the cylindrical target 23, which is opposed to the confined high density plasma, the ions in the high density plasma are efficiently extracted and made to impinge on the inner surface of the cylindrical target 23, thereby causing the sputtering thereof. When the extracted ions impinge on the inner surface of the cylindrical target 23, secondary electrons are emitted from the surface of the target 23 and are accelerated away from the target 23 with energies corresponding to the voltage applied to the target 23. These secondary electrons have high energies and greatly effect the ionization of a gas in generation chamber 14.

Figure 18A:
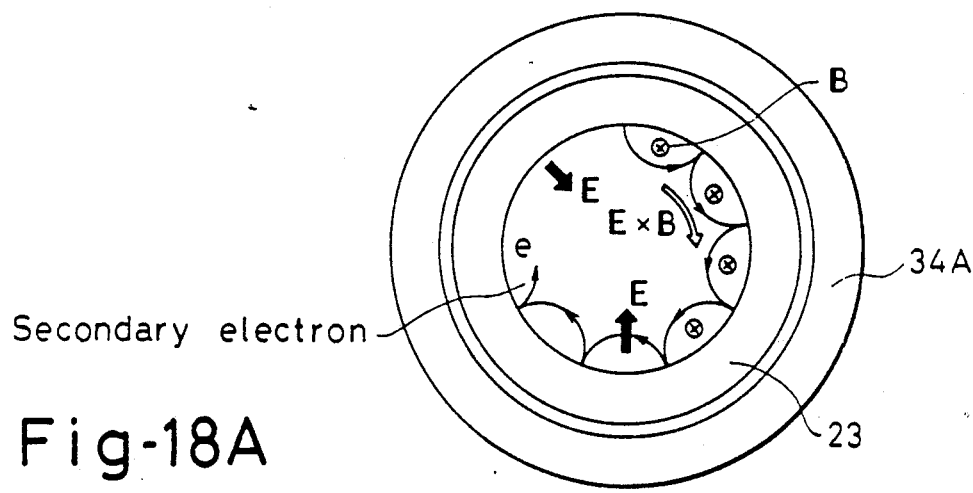
FIGS. 18A and 18B are diagrams for explaining the motion of electrons at the surface of a target, respectively.
Figure 18B:
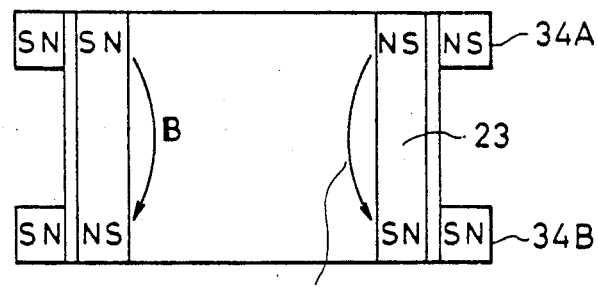

The ring-shaped permanent magnets 34A and 34B, which are disposed around the plasma generation chamber 14 at the upper and lower ends of the cylindrical target 23 and which have an opposing polarity relationship with each other as noted above, cause leakage of the magnetic field B which in turn effectively confines the secondary electrons. The underlying principle of this phenomenon will be described with reference to FIG. 18A, which shows a horizontal cross section of the plasma chamber 14, and FIG. 18B, which illustrates a vertical sectional view thereof.

Secondary electrons, which are accelerated by the electric field E produced over the surface of the target 23 by the voltage applied to the target 23, are deflected by the magnetic field B and are forced to return to the target 23. However, they are accelerated in the opposite direction by the electric field E. While repeating the above-mentioned motions the high-energy secondary electrons drift in the E × B direction (that is, in the circumferential direction of the inner circle of the target 23), and during this process they repeatedly collide with the neutral particles. As a result, highly efficient ionization of gas and hence highly efficient sputtering can be accomplished at a relatively low voltage applied to the target 23.

Figure 19:
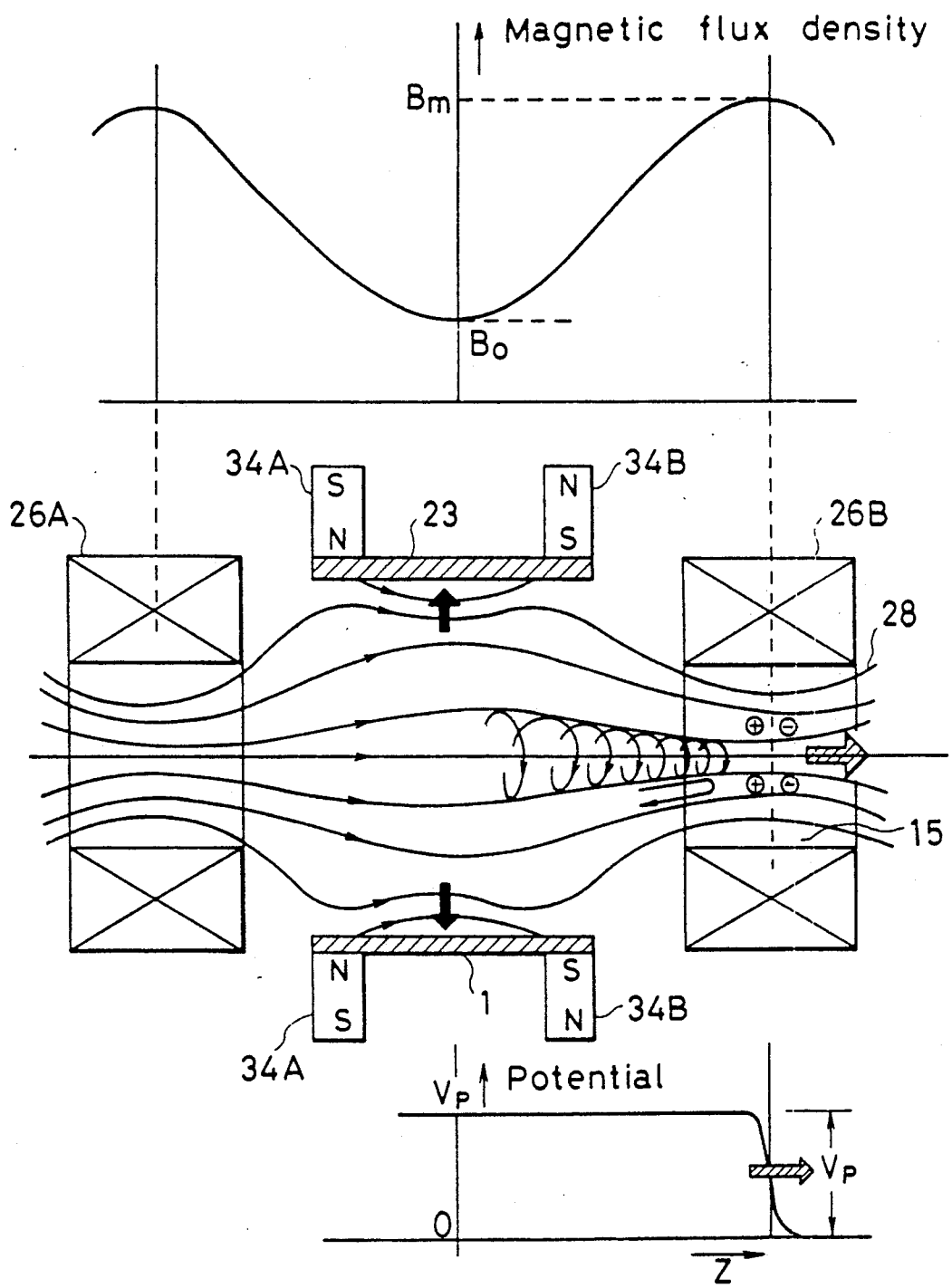
FIG. 19 is a diagram illustrating the magnetic field, motion of ions and the potential distribution in the fourth embodiment shown in FIG. 17.

FIG. 19 is a diagram illustrating the motions of the electrons and ions in this embodiment. FIG. 19 is similar to FIG. 7 except that the permanent magnets 34A and 34B are disposed so that distribution of the lines of magnetic force varies at the outermost side. As has been described before, when many electrons escape from one end of a mirror magnetic field the positive ions remain in the mirror magnetic field, and the resulting charge separation causes an electric field to be induced naturally in the vicinity of the end. Equilibrium is attained when the potential difference (Vp) between the inner and outer potentials becomes equivalent to the average energy of the electrons. Since the electric field decelerates the electrons but accelerates the ions, the amounts of emitted electrons and ions become substantially equal to each other.

Next, the results experiments in which Al films were formed by this embodiment will be described. First, the specimen chamber 16 was evacuated to $5\times10^{-7}$ Torr and then Ar gas was introduced into the plasma generation chamber 14 until the gas pressure therein rose to $3\times10^{-4}$ Torr. Films were formed under the following conditions: The microwave power was between 100 and 800 W, the voltage applied to the Al target was $-300$ V to $-1$ kV, the magnetic flux density at the surface of the target was maintained at 400G, and the gradient of the mirror magnetic field was maintained at 2kG/700G. The substrate 21A holder was disposed at the lower end of the lower mirror coil 26B and was not heated. Then the sputtering process was started and thin films were efficiently formed at deposition rates of 100-2800 Å/min. As compared with film formation processes under the same conditions except for the presence of permanent magnets 34A and 34B, the same deposition rate was obtained by applying a voltage to the target 23 which was about 70% of the voltage applied to the targets in the comparison processes. Therefore, a film of 2 μm or more in thickness can be formed in a stable state without cracking and exfoliation because the internal stresses in the film are lower as compared with the films formed by the prior art sputtering processes. In this case, the average energy of the ions varied from 5 eV to 25 eV and 10–30% of the particles traveling toward the substrate were ions.

Figure 20:
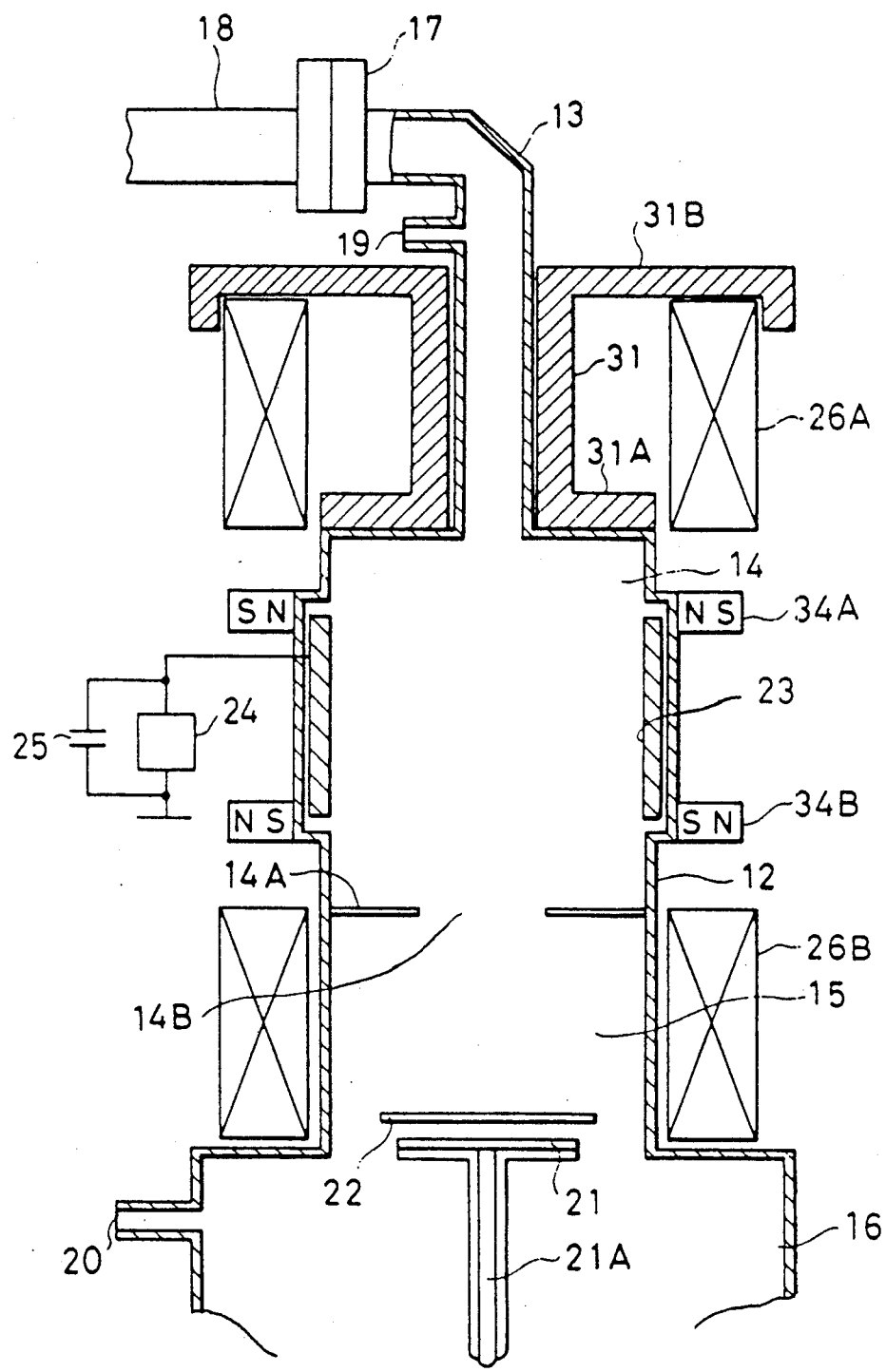
FIG. 20 is a sectional view showing a fifth embodiment of a thin film forming apparatus in accordance with the present invention.
Figure 21:
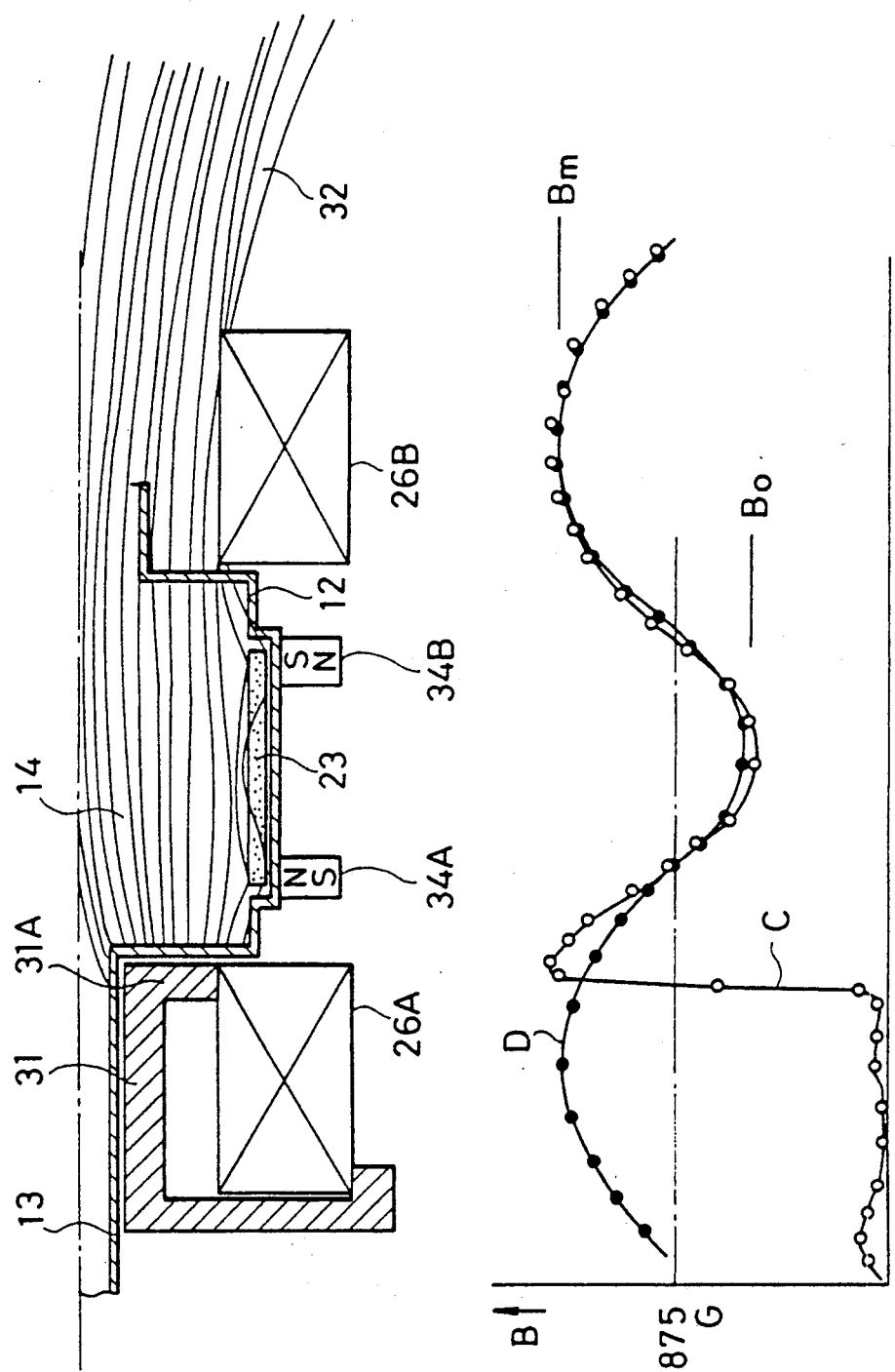
FIG. 21 is a diagram illustrating the magnetic field intensity distribution in the fifth embodiment shown in FIG. 20.

Next referring to FIG. 20, a fifth embodiment of a thin film forming apparatus according to the present invention will be described. It is equipped not only with a yoke 31 as described above with reference to FIG. 10 but also with permanent magnets 34A and 34B as described above in conjunction with FIG. 17. Except these component parts, this embodiment is substantially similar in construction to the embodiment described above with reference to FIGS. 5 and 6. The distribution of the magnetic field intensity in the direction of the magnetic flux is shown by the curve C in FIG. 21 while the distribution when no yoke is used is indicated by the curve D. As in the case of the curve B in FIG. 11, the distribution of the magnetic field intensity in this embodiment (the curve C) abruptly varies between the vacuum waveguide 13 and the plasma generation chamber 14. As a result, as described above with reference to FIG. 13, the plasma is not accelerated in the direction of the microwave waveguide, and accordingly the microwave introduction window 17 is prevented from being dimmed.

In this embodiment, since the permanent magnets 34A and 34B are provided as in the case of the embodiment shown in FIG. 17, it is possible to form a thin film at a high deposition rate and at a relatively low voltage applied to the target 23.

Figure 22:
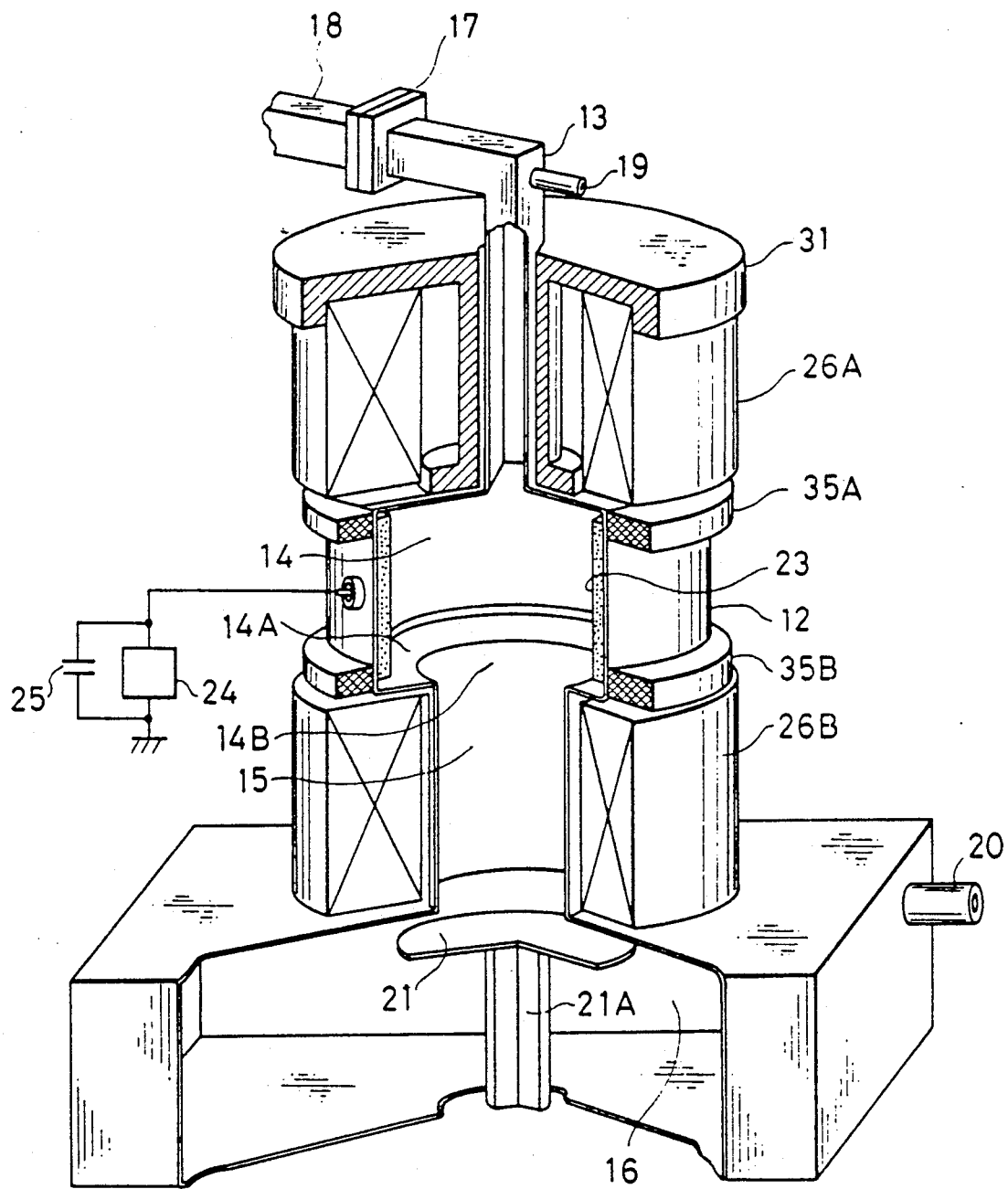
FIG. 22 is a partial cutaway view in perspective showing a sixth embodiment of a thin film forming apparatus in accordance with the present invention.

FIG. 22 shows a sixth embodiment of a thin film forming apparatus in accordance with the present invention. In this embodiment, the permanent magnets 34A and 34B are replaced by yokes 35A and 35B made of, for instance, soft magnetic iron. The yokes 35A and 35B converge the magnetic flux of the electromagnets 26A and 26B, respectively, and in turn cause leakage of the magnetic flux to the surface of the target 23. The effect attained is substantially similar to that obtained by the provision of the permanent magnets 34A and 34B.

Figure 15:
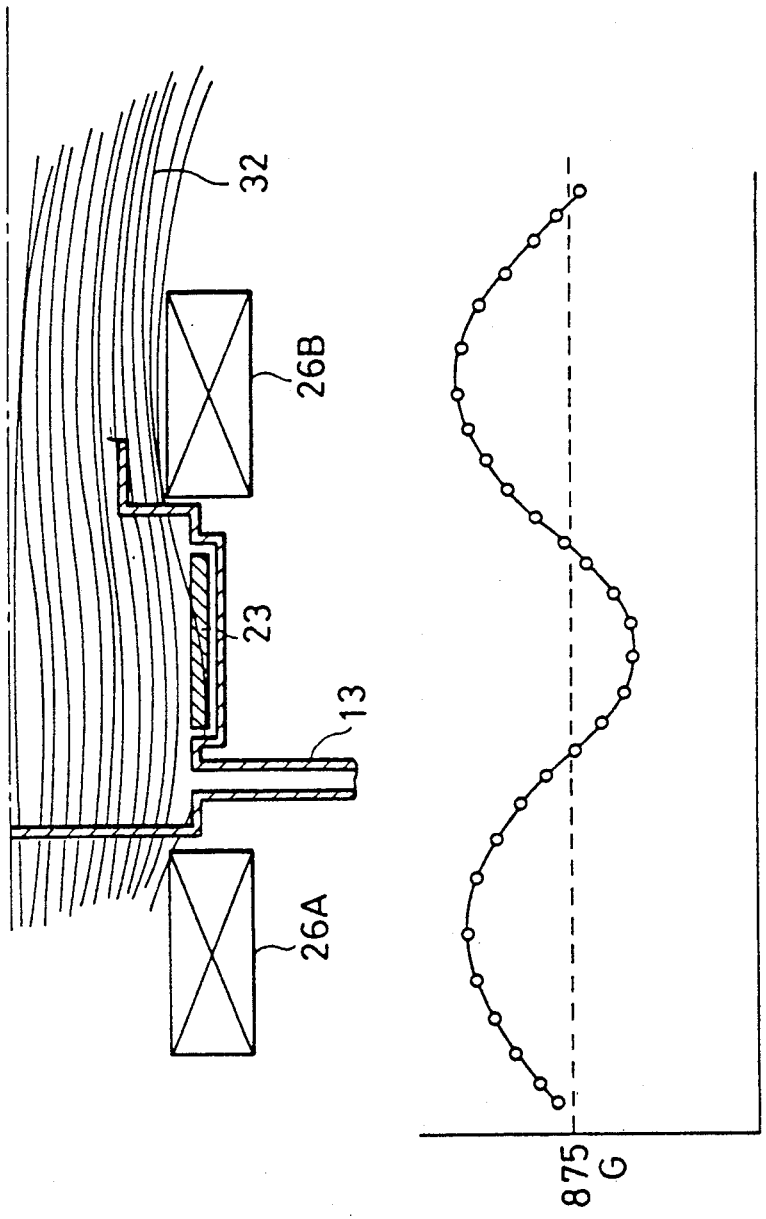
FIGS. 15 and 16 are diagrams illustrating the magnetic field intensity and the state of the generated plasma, respectively, in the third embodiment shown in FIG. 14.
Figure 23:
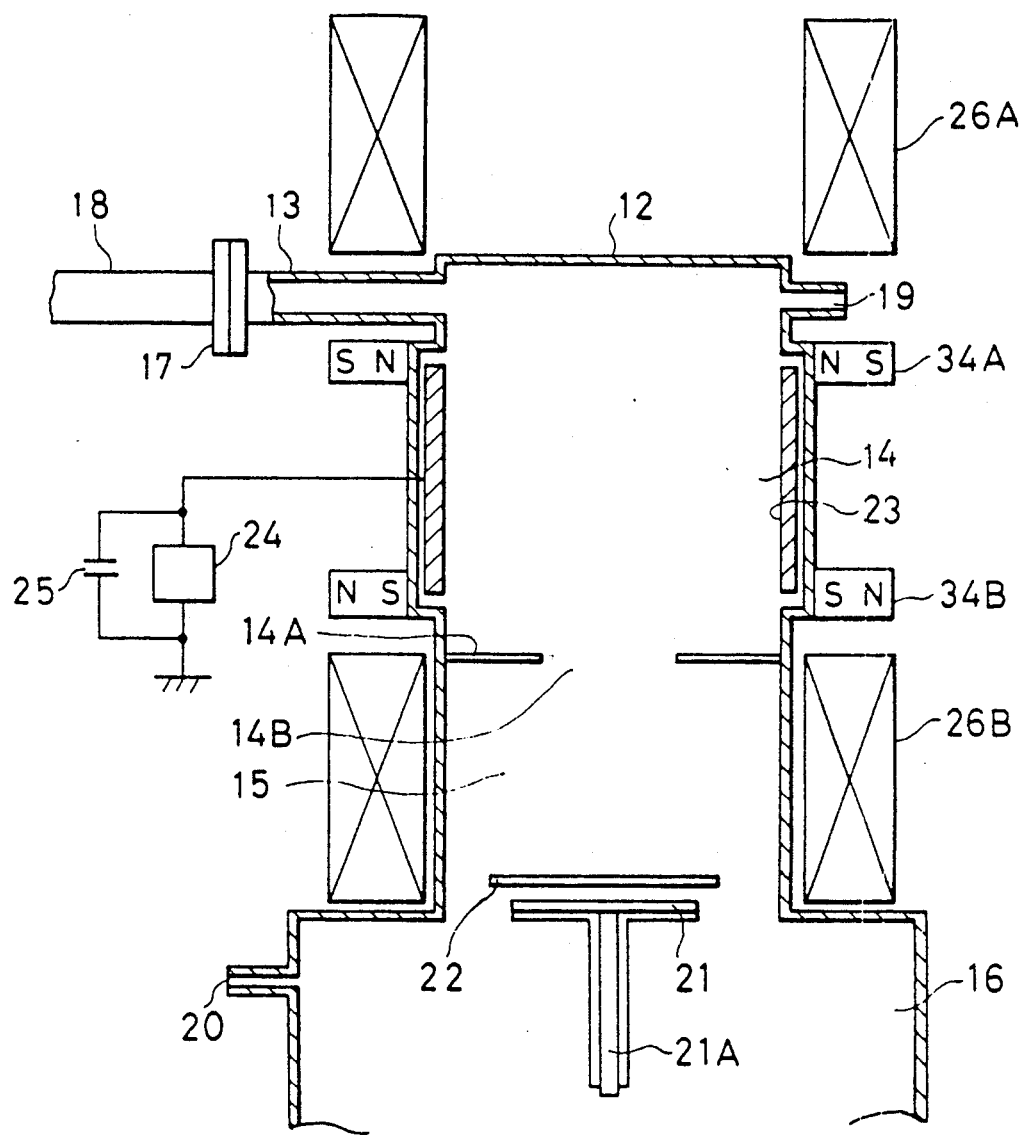
FIG. 23 is a sectional view showing a seventh embodiment of a thin film forming apparatus in accordance with the present invention.
Figure 24:
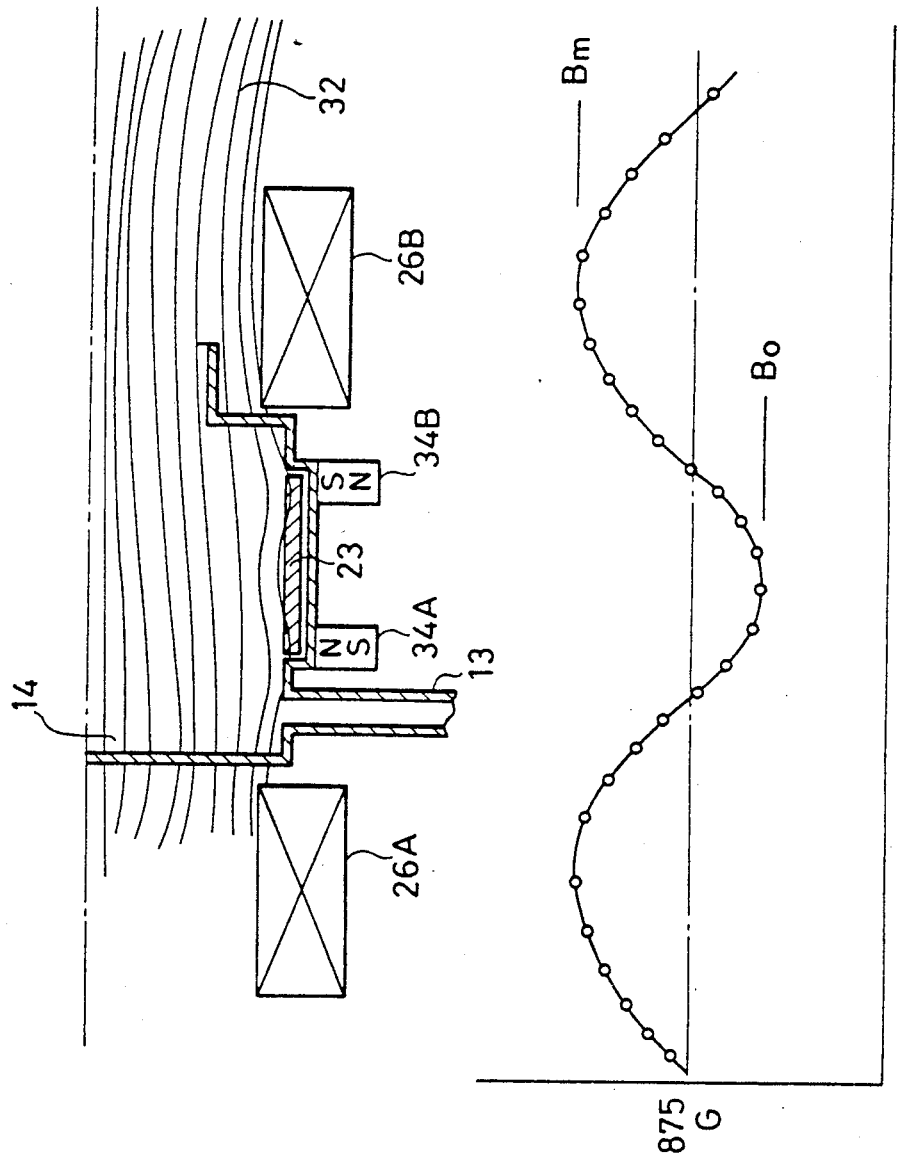
FIG. 24 shows the distribution of the magnetic field intensity in the embodiment shown in FIG. 23.

FIG. 23 shows a seventh embodiment of a thin film forming apparatus in accordance with the present invention. In this embodiment, the vacuum waveguide 13 is connected to the plasma generation chamber 14 perpendicular to the direction of the magnetic flux. This embodiment is also equipped with the permanent magnets 34A and 34B, and the formation of thin films can be carried out at a high rate and with a relatively low voltage applied to the target. FIG. 24 illustrates the distribution of the magnetic field intensity in the direction of the magnetic flux in this embodiment. The distribution of the magnetic flux is substantially similar to that (FIG. 15) of the embodiment described above with reference to FIG. 14. In this embodiment, the plasma is not accelerated in the direction of the vacuum waveguide 13, so that the microwave introduction window 17 is prevented from being dimmed. As a result, even if an electrically conductive material is used as a target 23, it is possible to continue the formation of a thin film for a long period of time in a stable manner. It is preferable that the vacuum waveguide 13 has at least one bend.

In the above-described embodiments, the magnetic coils 26A and 26B are used to obtain a mirror field, but it will be apparent to those skilled in the art that various permanent magnets and combinations thereof can be used to produce a mirror field and that the gradient of the mirror field can be made asymmetrical.

Furthermore, it will be apparent that suitable electromagnets, yokes and combinations thereof may be used to cause the leakage of the magnetic flux to the surface of a cylindrical target.

In various embodiments described above, the yokes 31 are disposed around the vacuum waveguide 13 in order to absorb the magnetic flux in the vacuum waveguide 13, but it will be apparent that the same effect can be obtained if the vacuum waveguide 13 is made of a suitable material capable of absorbing the magnetic flux.

So far the embodiments of the thin film forming apparatus in accordance with the present invention have been described as being equipped with an ion generation apparatus in which a target 23 is sputtered by high density plasma and the sputtered particles are then ionized. One or more yokes, a vacuum waveguide connected to the plasma generation chamber perpendicular to the magnetic flux, and permanent magnets or yokes disposed so as to surround the plasma generation chamber in opposed relationship with the upper and lower ends of the target placed in the plasma generation chamber, can be used to improve the embodiment shown in FIGS. 8 and 9 of an ion source in accordance with the present invention. Several embodiments of the ion source of the present invention will be described in detail below.

Figure 25:
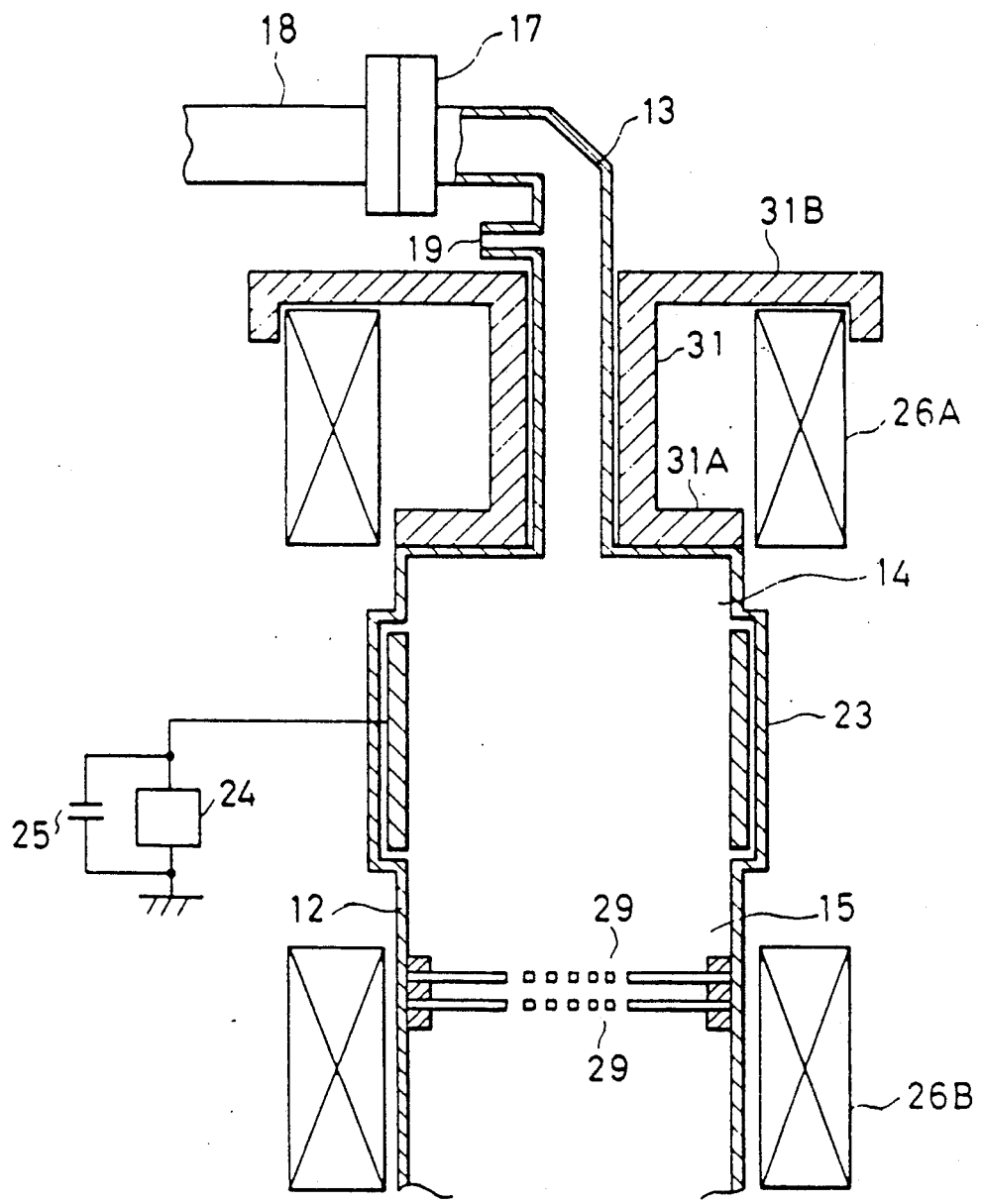
FIG. 25 is a sectional view showing a second embodiment of an ion source in accordance with the present invention.

FIG. 25 is a sectional view showing an ion source equipped with a yoke 31 made of, for instance, soft magnetic iron. As in the case of the thin film forming apparatus shown in FIG. 10, the cylindrical surface 31A of the yoke 31, which is opposite the outer cylindrical wall of the plasma generation chamber 14, is enlarged in area as much as is practical so that a uniform magnetic field distribution can be obtained within the plasma generation chamber 14. In addition, in order to decrease the magnetic resistance of the electromagnet 26A itself, the outer end 31B of the yoke 31 is so disposed as to surround one end of the electromagnet 26A so as to absorb the magnetic flux. Furthermore, the vacuum waveguide 13 is made in the form of an L and the microwave introduction window 17 is disposed at a position which cannot be viewed from the target 23. The rest of the construction is substantially similar to that of the ion source shown in FIGS. 8 and 9. In FIG. 25, the specimen chamber, the substrate and the exhaust port are not shown for the sake of simplicity.

Figure 26:
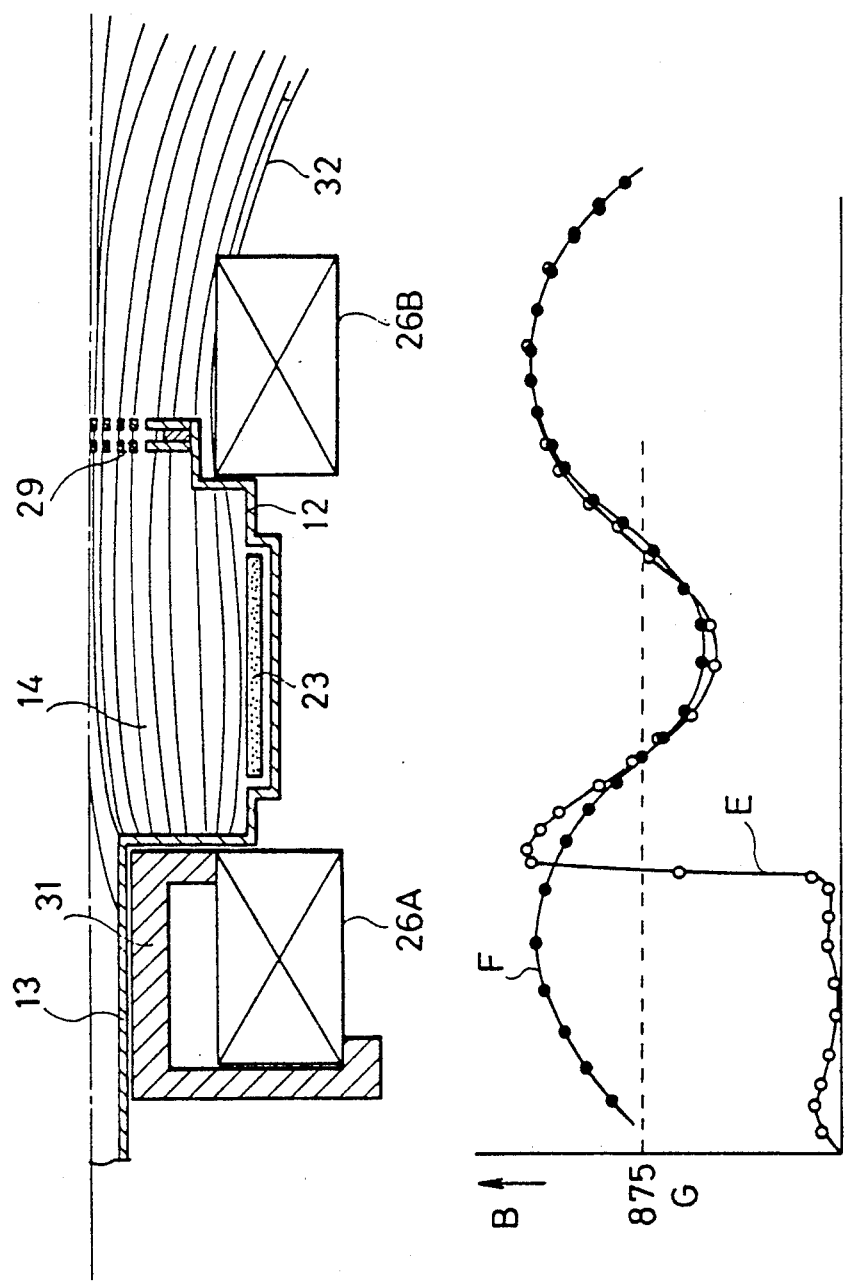
FIGS. 26 and 27 are diagrams illustrating the distribution of the magnetic field intensity and the state of the generated plasma, respectively, in the second embodiment shown in FIG. 25.
Figure 27:
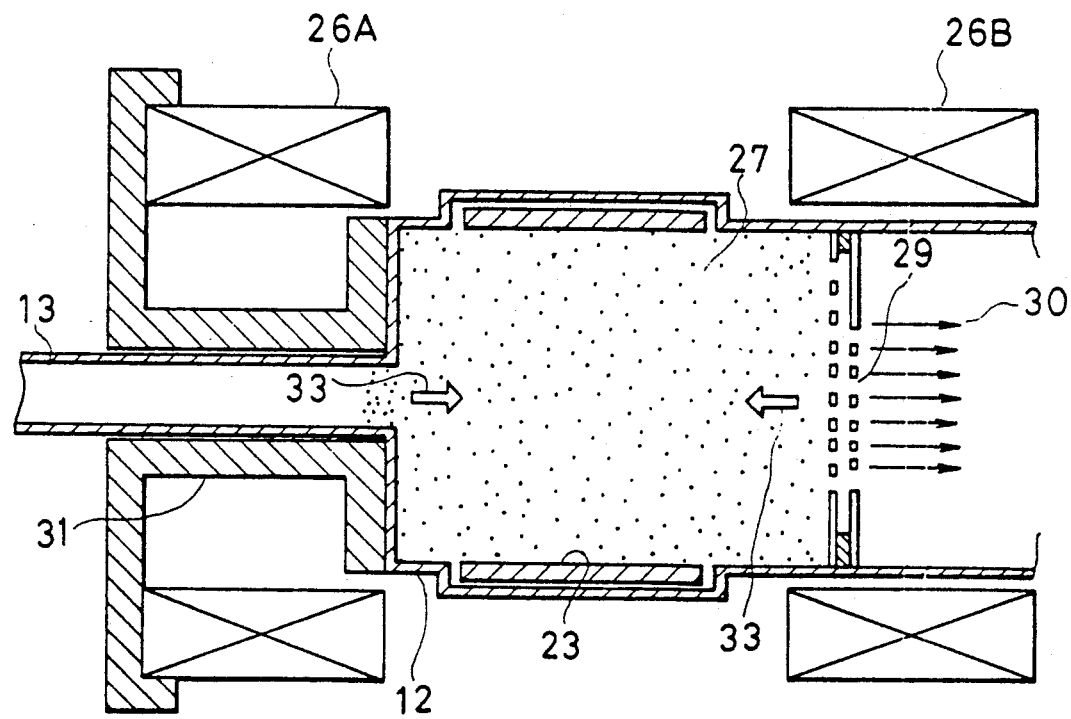

FIG. 26 illustrates the distribution of the magnetic field intensity in the direction of the magnetic flux in the embodiment of the ion source shown in FIG. 25. The curve E indicates the intensity of the magnetic field while the curve F indicates the intensity of the magnetic field if the yoke 31 were not used. Regardless of whether an extraction grid is provided or not, the intensity of the magnetic field abruptly varies between the vacuum waveguide 13 and the plasma generation chamber 14. Therefore, the direction of the acceleration of the plasma is toward the inside of the ion generation chamber 14 as shown in FIG. 27, and the plasma is not accelerated in the direction of the vacuum waveguide 13. As a result, even when the ion beams are extracted for a long period of time, they can be extracted in a stable manner without dimming the microwave introduction window 17.

Figure 28:
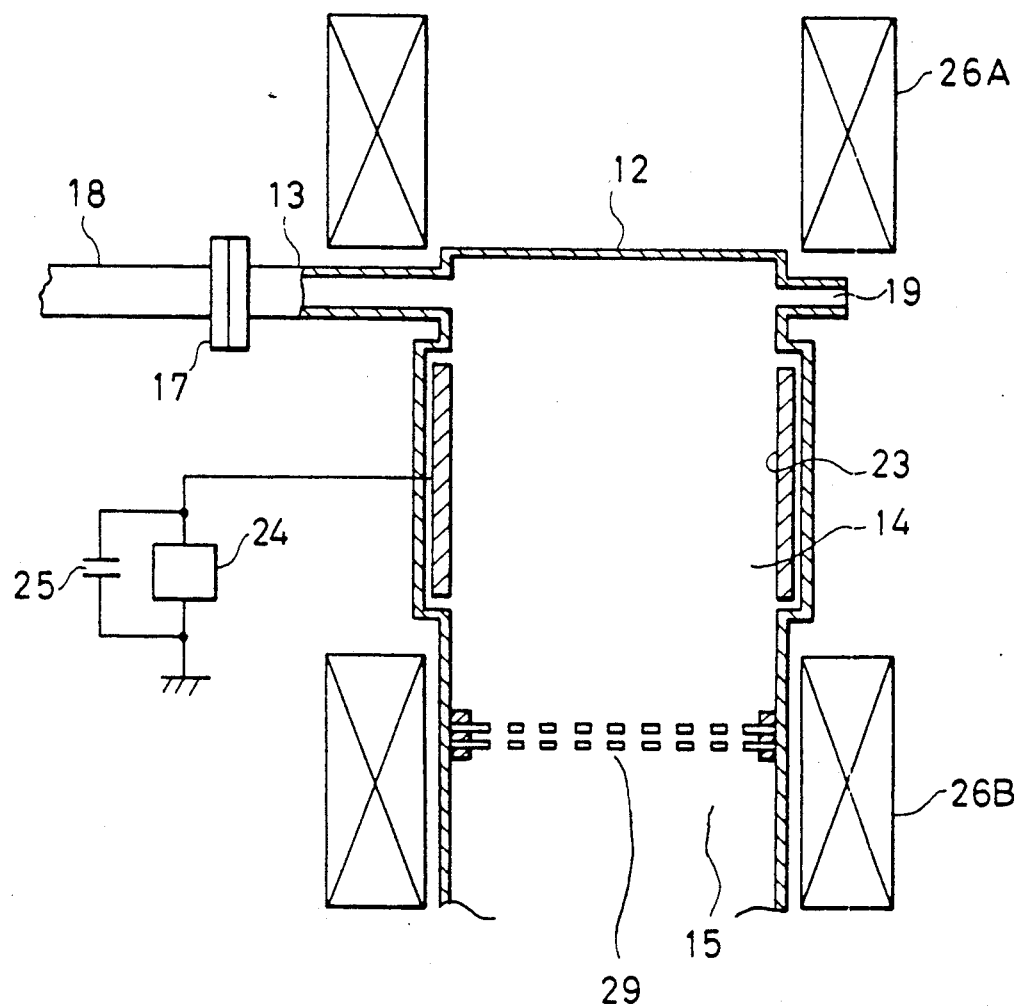
FIG. 28 is a sectional view showing a third embodiment of an ion source in accordance with the present invention.

FIG. 28 is a sectional view showing a third embodiment of an ion source in accordance with the present invention. In this embodiment, the vacuum waveguide 13 is connected to the plasma generation chamber 14 in a direction perpendicular to the magnetic flux and the microwave introduction window 17 is disposed at a position which cannot be viewed directly from the target 23.

Figure 29:
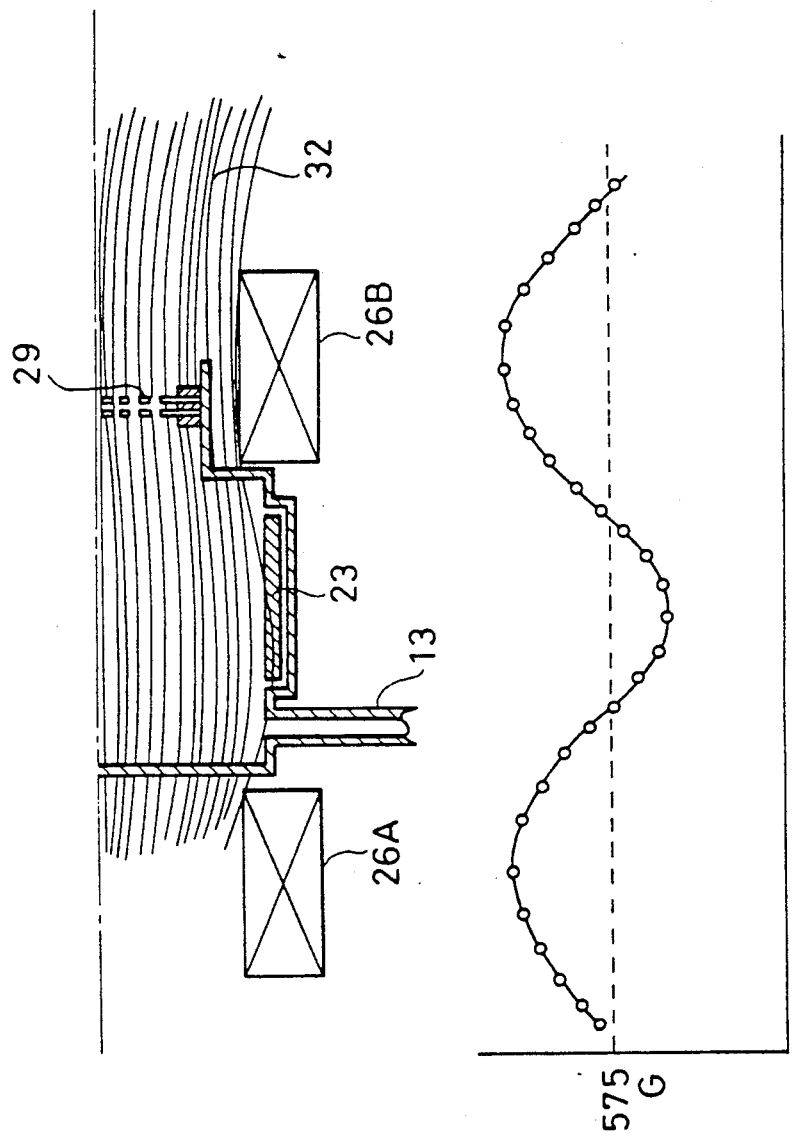
FIGS. 29 and 30 are diagrams illustrating the distribution of the intensity of the magnetic field and the state of the generated plasma in the embodiment shown in FIG. 28.
Figure 30:
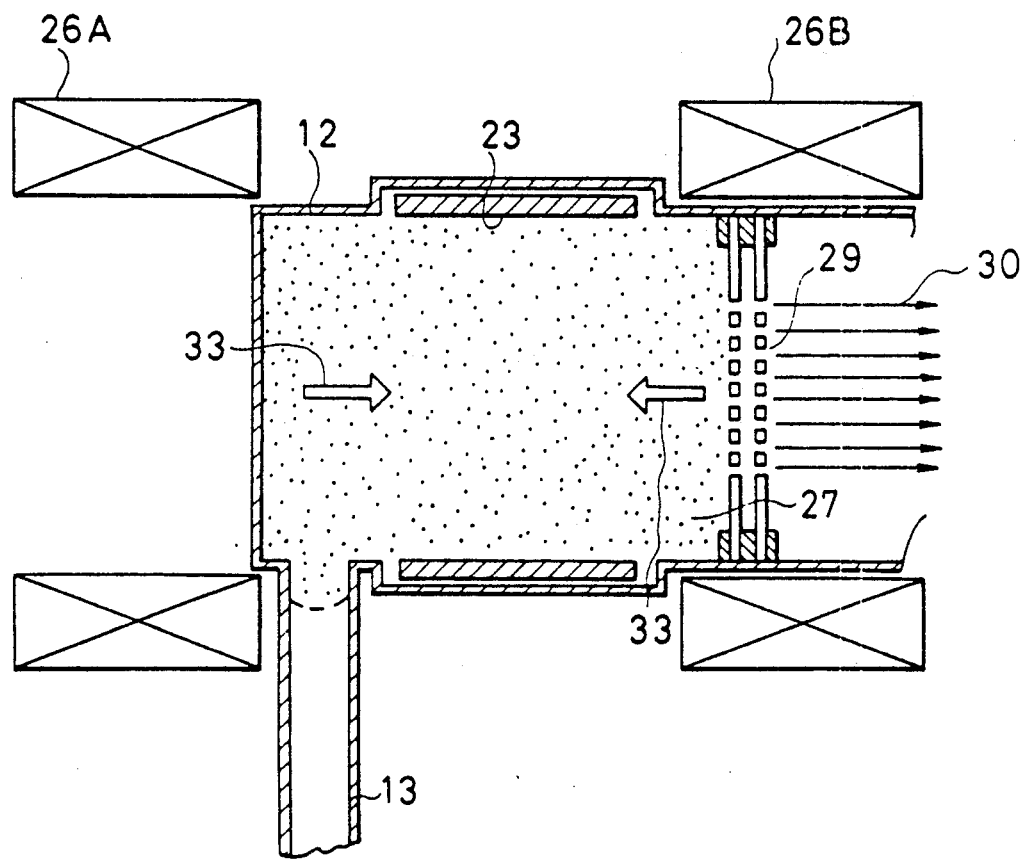

FIG. 29 illustrates the distribution of the magnetic field intensity in the direction of the magnetic flux in this embodiment of the ion source, and FIG. 30 illustrates the mode of plasma generation and the direction of acceleration thereof. The results of a comparison between FIG. 29 and FIG. 15 and between FIG. 30 and FIG. 1 show that the effects attained in the ion source by the connection of the vacuum waveguide 13 with the plasma generation chamber in a direction perpendicular to the magnetic flux are substantially similar to those attained by the thin film forming apparatus described above with reference to FIG. 14. That is, since the plasma is not diverged in the direction perpendicular to the magnetic flux, the microwave introduction window 17 will not be dimmed and the ion beams 30 can be extracted through the grid 29 in a stable manner. It follows therefore that it becomes possible to carry out the thin film formation process in a stable manner for a long period of time even when electrically conductive materials are used as a target material. It is preferable that the vacuum waveguide 13 has one or more bends.

Figure 31:
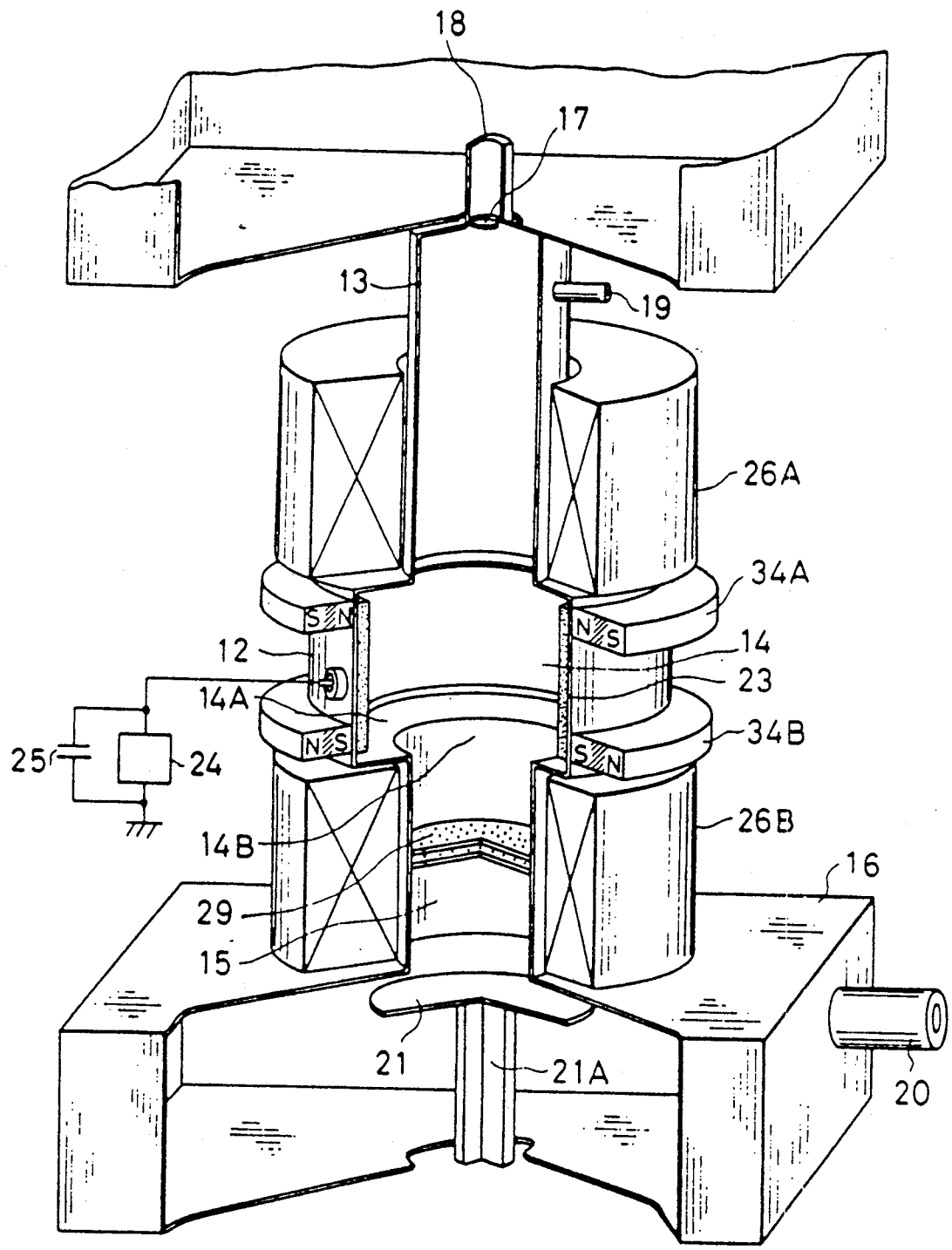
FIG. 31 is a partial cutaway view in perspective showing a fourth embodiment of an ion source in accordance with the present invention.

FIG. 31 shows a fourth embodiment of an ion source in accordance with the present invention. This embodiment is substantially similar in construction to the ion source described above with reference to FIGS. 8 and 9, except that in order to leak the magnetic flux to the inner surface of the cylindrical target 23, at least one pair of ring-shaped permanent magnets 34A and 34B are disposed in such a manner that the polarity of the magnet 34A is opposite to the polarity of the magnet 34B.

As described above, by applying a negative voltage to the target 23, which faces the high density plasma confined by the mirror field, the ions in the high density plasma are efficiently attracted to the target 23, causing sputtering. When the ions are attracted to and impinge on the surface of the target 23, secondary electrons are emitted from the surface of the target. These electrons are accelerated away from the target with energies corresponding to the voltage applied to the target. The secondary electrons have relatively high energies, and therefore greatly affect the efficient ionization of gas.

The secondary electrons, which are accelerated by the electric field E at the surface of the target 23 produced by the voltage applied thereto, are deflected by the magnetic field B produced by the permanent magnets 34A and 34B and are forced to return in the direction of the target, but they are accelerated in the opposite direction by the electric field E. While repeating the above-described motion the high-energy electrons drift in the direction of $E \times B$, that is, in the circumferential direction of the inner circle of the target 23, and during these movements they repeatedly collide with the neutral particles. Therefore, highly efficient ionization of a gas and hence highly efficient sputtering can be carried out at a relatively low voltage applied to the target 23. Furthermore, part of almost all neutral particles sputtered from the cylindrical target 23 are ionized in the high electron temperature and high density plasma.

Next, the result of experiments in which Al films were formed by this embodiment will be described.

First, the plasma generation chamber 14 was evacuated to $5 \times 10^{-7}$ Torr and then Ar gas wa introduced into the plasma generation chamber 14 until the gas pressure therein rose to $3 \times 10^{-4}$ Torr. Thereafter, films were formed when the microwave power was 100–800 W, the voltage applied to the Al target 23 was −300 V to −1 kV, the magnetic flux density at the surface of the target 23 was 400G, and the gradient of the mirror field was maintained at 2kG/700G. In this case, Al$^+$ ions having energies ranging from 20 eV to 100 eV were extracted through the ion extraction grid 29. Film was efficiently formed at the deposition rate of 30–70 Å/min over the surface of the substrate 21 disposed below the grid. It is possible to form a film at the same deposition rate and with voltage applied to the target 23 which was about 70% lower than the voltage applied to the target in an apparatus having no permanent magnets 34A and 34B.

Figure 32:
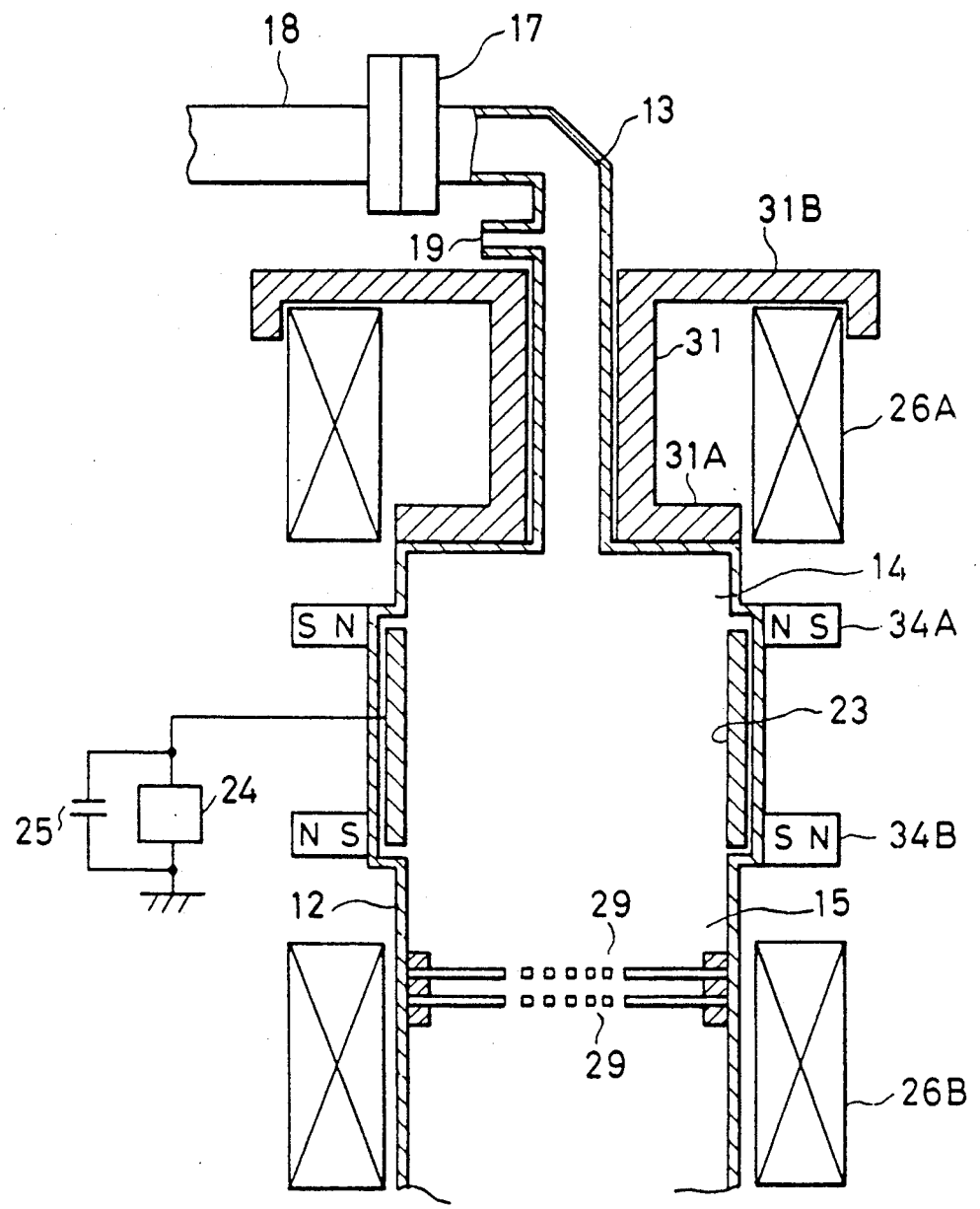
FIG. 32 is a sectional view showing a fifth embodiment of an ion source in accordance with the present invention.
Figure 33:
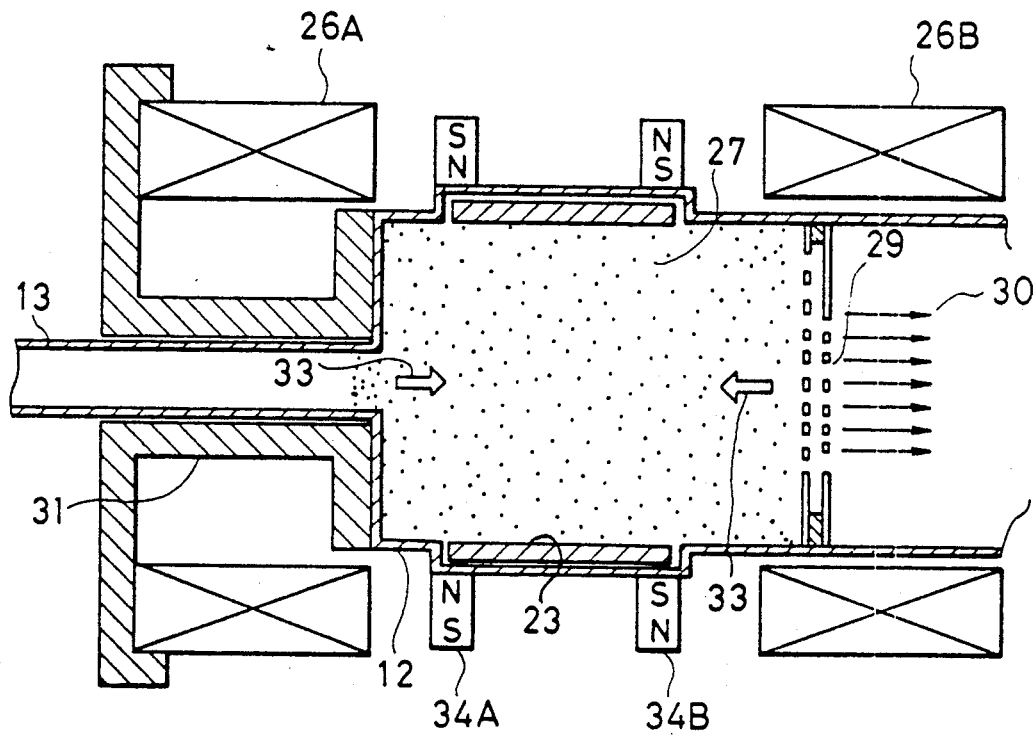
FIG. 33 is a diagram illustrating the state of the generated plasma in the embodiment shown in FIG. 32.

FIG. 32 shows a fifth embodiment of an ion source in accordance with the present invention. This embodiment is substantially similar to the embodiment shown in FIG. 31, except that this embodiment is equipped with a yoke 31 as shown in FIG. 25. In this embodiment, the permanent magnets 34A and 34B are provided, so that the voltage to be applied to the target 23 can be decreased further. As is apparent from FIG. 33, illustrating the mode of generation of plasma 27 and the direction 33 in which the plasma is accelerated, because of the effect of the yoke 31, the plasma is not accelerated in the direction of the vacuum waveguide 13, and accordingly the microwave introduction window 17 is prevented from being dimmed.

Figure 34:
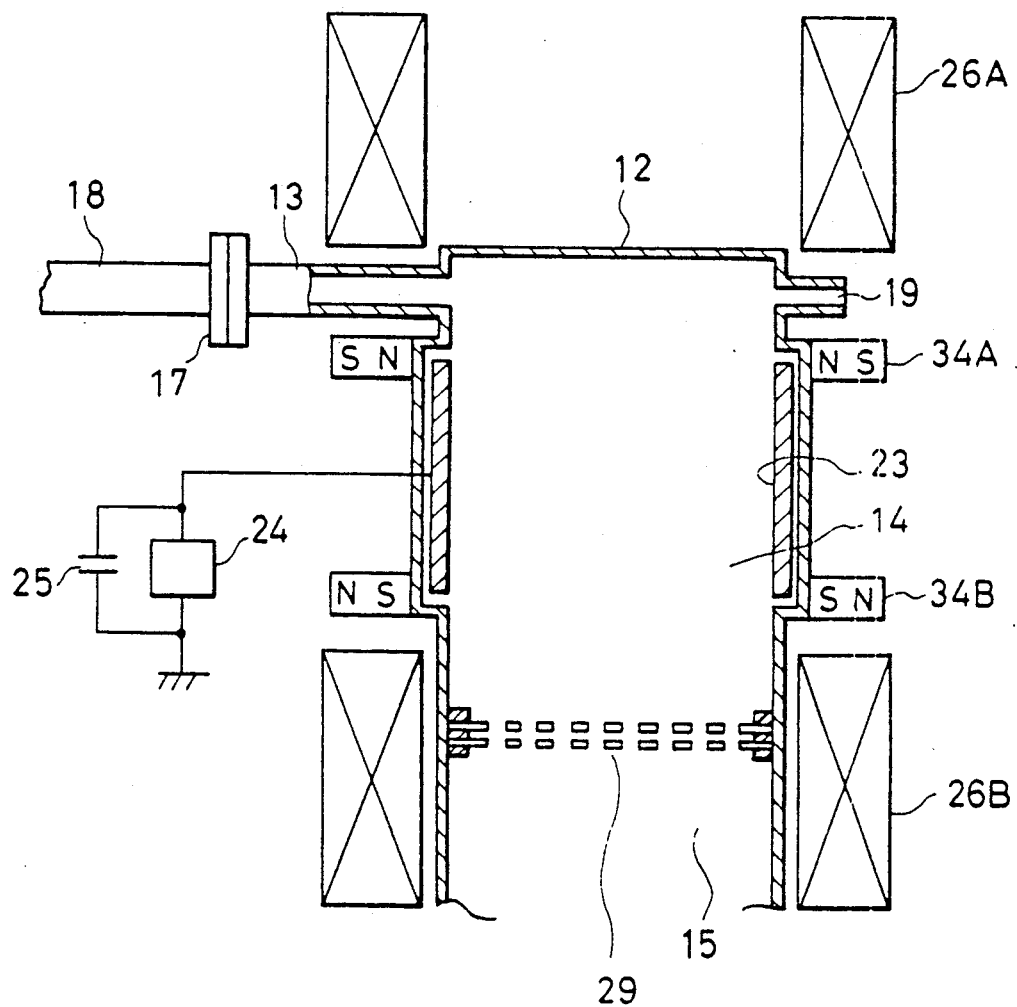
FIG. 34 is a sectional view showing a sixth embodiment of an ion source in accordance with the present invention.
Figure 35:
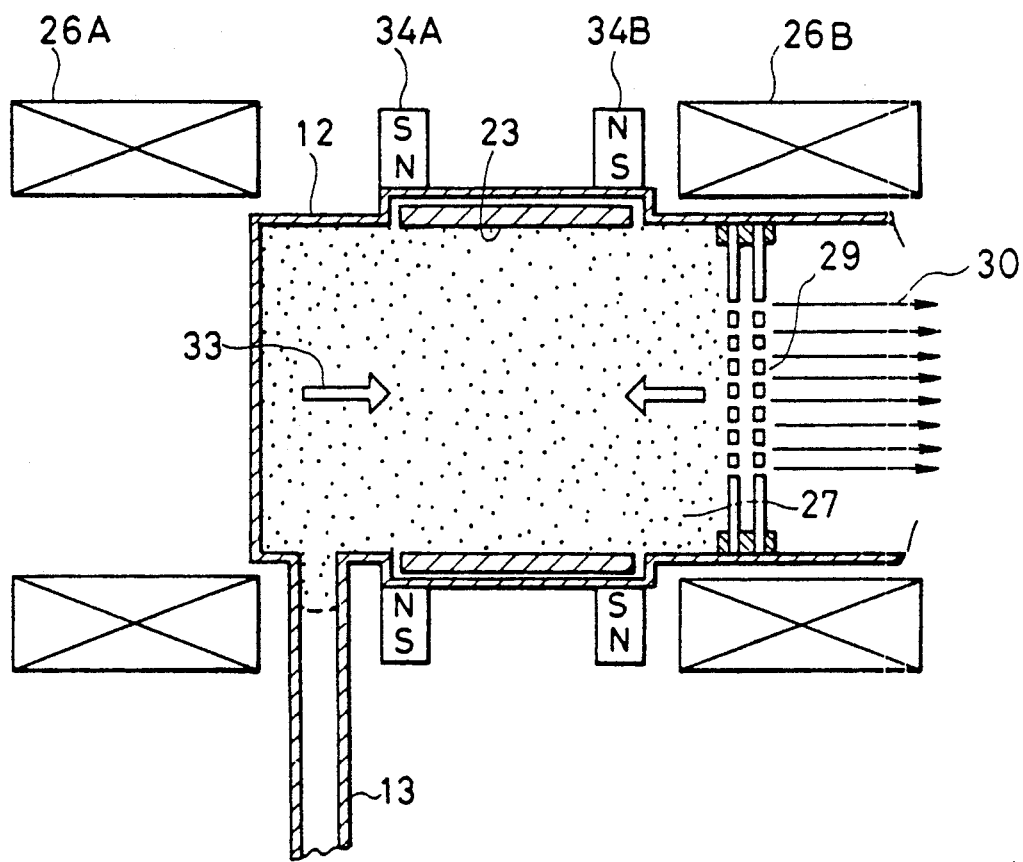
FIG. 35 shows the state of the generated plasma therein.

FIG. 34 shows a sixth embodiment of an ion source in accordance with the present invention. This embodiment is substantially similar in construction to the ion source described above with reference to FIG. 31 except for the fact that vacuum waveguide 13 is connected to the plasma generation chamber 14 in a direction perpendicular to the magnetic flux. FIG. 35 illustrates the plasma generation mode and the direction in which the plasma is accelerated. It will be apparent that the plasma does not transverse the magnetic flux and does not diverge in the direction of the vacuum waveguide 13, and accordingly the microwave introduction window 17 is not dimmed. This effect is enhanced when the vacuum waveguide 13 has one or more bends. The ion beams 30 are efficiently extracted through the ion extracting grid 29. Therefore, even when electrically conductive materials are used as the target 23, the ion beams 30 (each having a high current) can be extracted for a long period of time in a stable manner at a relatively low voltage applied to a target.

In the embodiments of the ion source in accordance with the present invention, magnetic coils are used to produce a mirror field, but it will be apparent that a mirror field can be produced by various permanent magnets and various combinations thereof and that the same effects described above can be attained. Furthermore, it will be apparent that a mirror field may be asymmetrical.

Furthermore, in order to permit the leakage of the magnetic flux to the surface of the cylindrical target, a pair of ring-shaped permanent magnets are used in the above-described embodiments, but it will be apparent that the same effect can be attained by using suitable electromagnets, yokes or various combinations thereof.

Moreover, in the above-described embodiments, in order to absorb the magnetic flux in the vacuum waveguide, the vacuum waveguide is surrounded by a yoke, but it will also be apparent that the same effect can be attained if the vacuum waveguide is made of a suitable material capable of effectively absorbing the magnetic flux.

INDUSTRIAL APPLICABILITY

As described above, in an ion generation apparatus in accordance with the present invention, plasma is generated using microwaves under the condition of electron cyclotron resonance and the plasma is trapped or confined by a mirror field, and sputtering is carried out by efficiently extracting the ions from the high density plasma. As compared with the prior art sputtering apparatus, highly active plasma can be generated at a low gas pressure and a film can be formed at a high rate and under a low pressure. Furthermore, the energies of particles can be controlled over a wide range, from a few electron volts to thousands of electron volts, and the dispersion of the energies can be reduced to a minimum.

By using an ion generation apparatus in accordance with the present invention, not only can a high quality film having a high degree of purity and relatively few defects be formed at a high rate and at a high degree of efficiency, but also a film of an unequilibrium material can be formed at a low temperature, which was impossible heretofore. Furthermore, according to the present invention, because of the effect attained by a ring-shaped permanent magnet disposed so as to surround the outer side of a cylindrical target, a highly efficient sputtering process can be carried out even when the voltage applied to the target is decreased as compared with an apparatus that is not equipped with a permanent magnet.

When the vacuum waveguide and the magnetic flux absorbing yoke are used, the microwave introduction window is prevented from becoming dim, so that a high quality film having a high degree of purity and having relatively few defects can be continuously formed over the surface of a substrate maintained at a low temperature. The film can be formed at a high growing rate and with a high degree of efficiency for a long period of time and in a stable manner, regardless of the degree of conductivity and thickness of the film.

Furthermore, when the vacuum waveguide is connected to the plasma generation chamber in a direction perpendicular to the magnetic flux, the microwave introduction window is substantially prevented from becoming dim and, regardless of a degree of conductivity and a thickness of the film, the film formation can be carried out continuously for a long period of time.

In the ion sources in accordance with the present invention, a sputtering process is carried out by efficiently extracting ions from high density plasma. The neutral particles produced by the sputtering are ionized in the highly active plasma at a low gas pressure and then extracted with a high degree of efficiency. As compared with the prior art ion sources, ion extraction at an extremely high electric current density can be realized. Further ions of various high purity metals and compounds can be deposited and etching by these ions can be carried out. In addition, the present invention has the feature that the energy of the ions can be freely controlled over a wide range, from several electron volts to several kilo electron volts. Furthermore, according to the present invention, due to the effects of the permanent magnets disposed so as to surround a cylindrical target, high efficiency sputtering can be realized even with a low voltage applied to the target as compared with ion sources not equipped with such permanent magnets.

Furthermore, in accordance with the present invention, a vacuum waveguide and a magnetic flux absorbing yoke are used so that the microwave introduction window can be prevented from becoming dim. As a result, metal ions can be continuously extracted from a long period of time and in a stable manner.

Moreover, according to the present invention, the vacuum waveguide is connected to the plasma generation chamber in a direction perpendicular to the magnetic flux, so that the microwave introduction window can be prevented from becoming dim. Regardless of the kinds of ions and the degree of conductivity and the thickness of the film, ions can be continuously extracted for a long period of time and in a stable manner.

We claim:

1. An ion generation apparatus, comprising:
   a vacuum chamber including a vacuum waveguide having a microwave introduction window at one end thereof, said microwave introduction window being connected to a microwave waveguide, a cylindrical plasma generation chamber having a diameter and a length sufficient to define a microwave cavity resonator for causing the resonance of a microwave to be introduced, and an end portion of said plasma generation chamber all connected with each other in the order named, and further having a gas introduction inlet;
   a tubular target disposed along an inner wall of said plasma generation chamber and supplied with a negative voltage; and
   at least one pair of magnetic field producing means which are disposed around said vacuum waveguide and said end portion of said plasma generation chamber so that a mirror field is produced in such a way that the strength of the magnetic field in said plasma generation chamber has a minimum in the neighborhood of the center of said plasma generation chamber.

2. An ion generation apparatus as claimed in claim 1, further comprising at least one pair of second magnetic field producing means disposed so as to surround said plasma generation chamber in opposite magnetic polarity relationship so that the magnetic flux leaks to the inner surface of said target.

3. An ion generation apparatus as claimed in claim 2, wherein said second magnetic field producing means is a ring-shaped permanent magnet.

4. An ion generation apparatus as claimed in claim 2, wherein said second magnetic field producing means is a magnetic yoke.

5. An ion generation apparatus as claimed in claim 1, wherein a magnetic flux absorbing yoke is disposed around said vacuum waveguide in such a way that said yoke surrounds one of said at least one pair of magnetic field producing means and is disposed along said vacuum waveguide.

6. An ion generation apparatus as claimed in claim 5, wherein said microwave introduction window is disposed at a position which cannot be reached by any straight line extending within said vacuum chamber from any point on said target.

7. An ion generation apparatus as claimed in claim 5, wherein said microwave introduction window is provided at a predetermined distance from said plasma generation chamber, said predetermined distance being longer than the distance from said plasma generation chamber to a cross point of said vacuum waveguide and a line drawn from any point on a surface of said target to a portion of a wall of said plasma generation chamber at which said vacuum waveguide is connected thereto.

8. An ion generation apparatus as claimed in claim 1, wherein said vacuum waveguide is connected to said plasma generation chamber in a direction perpendicular to the direction of the magnetic flux.

9. An ion generation apparatus as claimed in claim 8, wherein said microwave introduction window is disposed at a position which cannot be reached by any straight line extending within said vacuum chamber from any point on said target.

10. An ion generation apparatus as claimed in claim 8, wherein said microwave introduction window is provided at a predetermined distance from said plasma generation chamber, said predetermined distance being longer than the distance from said plasma generation chamber to a cross point of said vacuum waveguide and a line drawn from any point on a surface of said target to a portion of a wall of said plasma generation chamber at which said vacuum waveguide is connected thereto.

11. A thin film forming apparatus, comprising:
a vacuum chamber including a vacuum waveguide having a microwave introduction window at one end thereof, said microwave introduction window being connected to a microwave waveguide, a cylindrical plasma generation chamber having a diameter and a length sufficient to define a microwave cavity resonator for causing the resonance of a microwave to be introduced, an end portion of said plasma generation chamber and a specimen chamber having a substrate holder disposed therein, all of which are connected with each other in the order named, and further having a gas introduction inlet;
a tubular target disposed along an inner wall of said plasma generation chamber and supplied with a negative voltage; and
at least one pair of magnetic field producing means disposed so as to surround said vacuum waveguide and said end portion of said plasma generation chamber so that a mirror field is produced in such a way that the strength of the magnetic field in said plasma generation chamber has a minimum in the neighborhood of the center of said plasma generation chamber.

12. A thin film forming apparatus as claimed in claim 11, further comprising at least one pair of second magnetic field producing means disposed around said plasma generation chamber in opposite magnetic polarity relationship so that the magnetic flux leaks to the inner surface of said target.

13. A thin film forming apparatus as claimed in claim 12, wherein said second magnetic field producing means is a ring-shaped permanent magnet.

14. A thin film forming apparatus as claimed in claim 12, wherein said second magnetic field producing means is a magnetic yoke.

15. A thin film forming apparatus as claimed in claim 11, wherein a magnetic flux absorbing yoke is disposed around said vacuum waveguide in such a way that said yoke surrounds one of said magnetic field producing means and is disposed along said vacuum waveguide.

16. A thin film forming apparatus as claimed in claim 15, wherein said microwave introduction window is disposed at a position which cannot be reached by any straight line extending within said vacuum chamber from any point on said target.

17. A thin film forming apparatus as claimed in claim 15, wherein said microwave introduction window is provided at a predetermined distance from said plasma generation chamber, said predetermined distance being longer than the distance from said plasma generation chamber to a cross point of said vacuum waveguide and a line drawn from any point on a surface of said target to a portion of a wall of said plasma generation chamber at which said vacuum waveguide is connected thereto.

18. A thin film forming apparatus as claimed in claim 11, wherein said vacuum waveguide is connected to said plasma generation chamber in a direction perpendicular to the direction of the magnetic flux produced by said magnetic field producing means.

19. A thin film forming apparatus as claimed in claim 18, wherein said microwave introduction window is disposed at a position which cannot be reached by any straight line extending within said vacuum chamber from any point on said target.

20. A thin film forming apparatus as claimed in claim 18, wherein said microwave introduction window is provided at a predetermined distance from said plasma generation chamber, said predetermined distance being longer than the distance from said plasma generation chamber to a cross point of said vacuum waveguide and a line drawing from any point on a surface of said target to a portion of a wall of said plasma generation chamber at which said vacuum waveguide is connected thereto.

21. A thin film forming apparatus as claimed in claim 11, wherein said substrate holder holds a substrate in such a manner that a surface of said substrate is maintained perpendicular to an axis of said tubular target.

22. An ion source, comprising:
a vacuum chamber including a vacuum waveguide having a microwave introduction window at one end thereof, said microwave introduction window being connected to a microwave waveguide, a cylindrical plasma generation chamber having a diameter and a length sufficient to define a microwave cavity resonator for causing the resonance of a microwave to be introduced, an end portion of said plasma generation chamber and a specimen chamber having a substrate holder disposed therein, all of which are connected to each other in the order named, and further having a gas introduction inlet;
a tubular target disposed along an inner wall of said plasma generation chamber and supplied with a negative voltage;
at least one pair of magnetic field producing means disposed so as to surround said vacuum waveguide and said end portion of said plasma chamber so that a mirror field is produced in such a way that the strength of the magnetic field in said plasma chamber has a minimum in the neighborhood of the center of said plasma generation chamber; and
an ion extraction mechanism which is disposed at said end portion of said plasma generation chamber to selectively extract ions which are obtained by sputtering of said target and are ionized within plasma.

23. An ion source as claimed in claim 22, further comprising at least one pair of second magnetic field producing means disposed so as to surround said plasma generation chamber in opposite magnetic polarity relationship so that the magnetic flux leaks to the inner surface of said target.

24. An ion source as claimed in claim 23, wherein said second magnetic field producing means is a magnetic yoke.

25. An ion source as claimed in claim 23, wherein said second magnetic field producing means is a ring-shaped permanent magnet.

26. An ion source as claimed in claim 22, wherein a magnetic flux absorbing yoke is disposed around said vacuum waveguide in such a way that said yoke surrounds said magnetic field producing means and is disposed along said vacuum waveguide.

27. An ion source as claimed in claim 26, wherein said microwave introduction window is disposed at a position which cannot be reached by any straight line extending within said vacuum chamber from any point on said target.

28. An ion source as claimed in claim 26, wherein said microwave introduction window is provided at a predetermined distance from said plasma generation chamber, said predetermined distance being longer than the distance from said plasma generation chamber to a cross point of said vacuum waveguide and a line drawn from any point on a surface of said target to a portion of a wall of said plasma generation chamber at which said vacuum waveguide is connected thereto.

29. An ion source as claimed in claim 22, wherein said vacuum waveguide is connected to said plasma generation chamber in a direction perpendicular to the direction of the magnetic field produced by said magnetic field producing means.

30. An ion source as claimed in claim 29, wherein said microwave introduction window is disposed at a position which cannot be reached by any straight line extending within aid vacuum chamber from any point on said target.

31. An ion source as claimed in claim 29, wherein said microwave introduction window is provided at a predetermined distance from said plasma generation chamber, said predetermined distance being longer than the distance from said plasma generation chamber to a cross point of said vacuum waveguide and a line drawn from any point on a surface of said target to a portion of a wall of said plasma generation chamber at which said vacuum waveguide is connected thereto.

32. An ion generation apparatus, comprising:
a vacuum chamber which includes
a plasma generation chamber having a first end and a second end and having an axis which runs through the ends, the second end of the plasma generation chamber having an aperture through which the axis extends, and
means for introducing microwave energy at a predetermined frequency into the plasma generation chamber, the plasma generation chamber being dimensioned to provide a microwave cavity resonator for microwaves having the predetermined frequency;
a tubular target having a first and a second end and having a passage between the first and second ends, the target being mounted in the plasma generation chamber so that the first end of the target is disposed adjacent the first end of the plasma generation chamber, the second end of the target is disposed adjacent the second end of the plasma generation chamber, and the axis of the plasma generation chamber extends through the passage, the target being supplied with a negative voltage;
a first annular magnet mounted at the first end of the plasma generation chamber so as to be coaxial with respect to the axis of the plasma generation chamber; and
a second annular magnet mounted at the second end of the plasma generation chamber so as to be coaxial with respect to the axis of the plasma generation chamber,
wherein the first and second magnets produce a magnetic field within the passage of the tubular target, the strength of the magnetic field within the passage of the tubular target having a minimum value at a position between the ends of the tubular target.

* * * * *